United States Patent
Obuchi et al.

(10) Patent No.: US 7,024,602 B2
(45) Date of Patent: Apr. 4, 2006

(54) TRANSMISSION FORMAT DETECTION METHOD

(75) Inventors: Kazuhisa Obuchi, Kawasaki (JP); Tetsuya Yano, Kawasaki (JP); Makoto Uchishima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 90 days.

(21) Appl. No.: 10/286,088

(22) Filed: Oct. 30, 2002

(65) Prior Publication Data
US 2003/0066009 A1    Apr. 3, 2003

Related U.S. Application Data

(63) Continuation of application No. PCT/JP00/04059, filed on Jun. 21, 2000.

(51) Int. Cl.
*G01R 31/28* (2006.01)

(52) U.S. Cl. .............. 714/712; 714/776; 714/704

(58) Field of Classification Search .............. 714/752, 714/701, 799, 48, 52, 712, 758, 776, 704
See application file for complete search history.

(56) References Cited

U.S. PATENT DOCUMENTS

| | | | | |
|---|---|---|---|---|
| 4,802,171 | A * | 1/1989 | Rasky ................ | 714/747 |
| 5,638,384 | A * | 6/1997 | Hayashi et al. ...... | 714/752 |
| 5,862,153 | A * | 1/1999 | Kikuchi et al. ...... | 714/775 |
| 6,522,665 | B1 * | 2/2003 | Suzuki et al. ........ | 370/471 |
| 6,560,725 | B1 * | 5/2003 | Longwell et al. ..... | 714/54 |
| 6,674,807 | B1 * | 1/2004 | Park et al. ........... | 375/265 |
| 6,678,854 | B1 * | 1/2004 | Irvin .................. | 714/752 |
| 2002/0006138 | A1 * | 1/2002 | Odenwalder .......... | 370/468 |
| 2003/0066008 | A1 * | 4/2003 | Kikuchi et al. ...... | 714/752 |

FOREIGN PATENT DOCUMENTS

| | | |
|---|---|---|
| JP | 61-89770 | 5/1986 |
| JP | 4-185157 | 7/1992 |

OTHER PUBLICATIONS

E.G. Coffman Jr. et al. Performance of the move-to-front algorithm with Markov-modulated request sequences. Operations Research Letters, vol. 25, No. 3, Oct. 1999, pp. 109-118.

Ng S C et al. Rate Determination Algorithms in IS-95 Forward Traffic Channels. IEEE Vehicular Technology Conference, vol. 46, No. 3 pp. 2187-2191 1998.

3rd Generation Partnership Project: Technical Specification Group Group Radio Access Network: Multiplexing and Channel Coding (FDD) pp. 1-52 1993.

* cited by examiner

*Primary Examiner*—Phung My Chung
(74) *Attorney, Agent, or Firm*—Katten Muchin Rosenman LLP

(57) ABSTRACT

A communication system transmits frames with an arbitrary information length among a plurality of possible information lengths. On receipt of a frame, a receiver performs Viterbi decoding and a CRC operation assuming that the information length of the relavent frame is the same as that of an immediately previous frame. The information length of the frame is detected based on the result of the CRC operation.

21 Claims, 26 Drawing Sheets

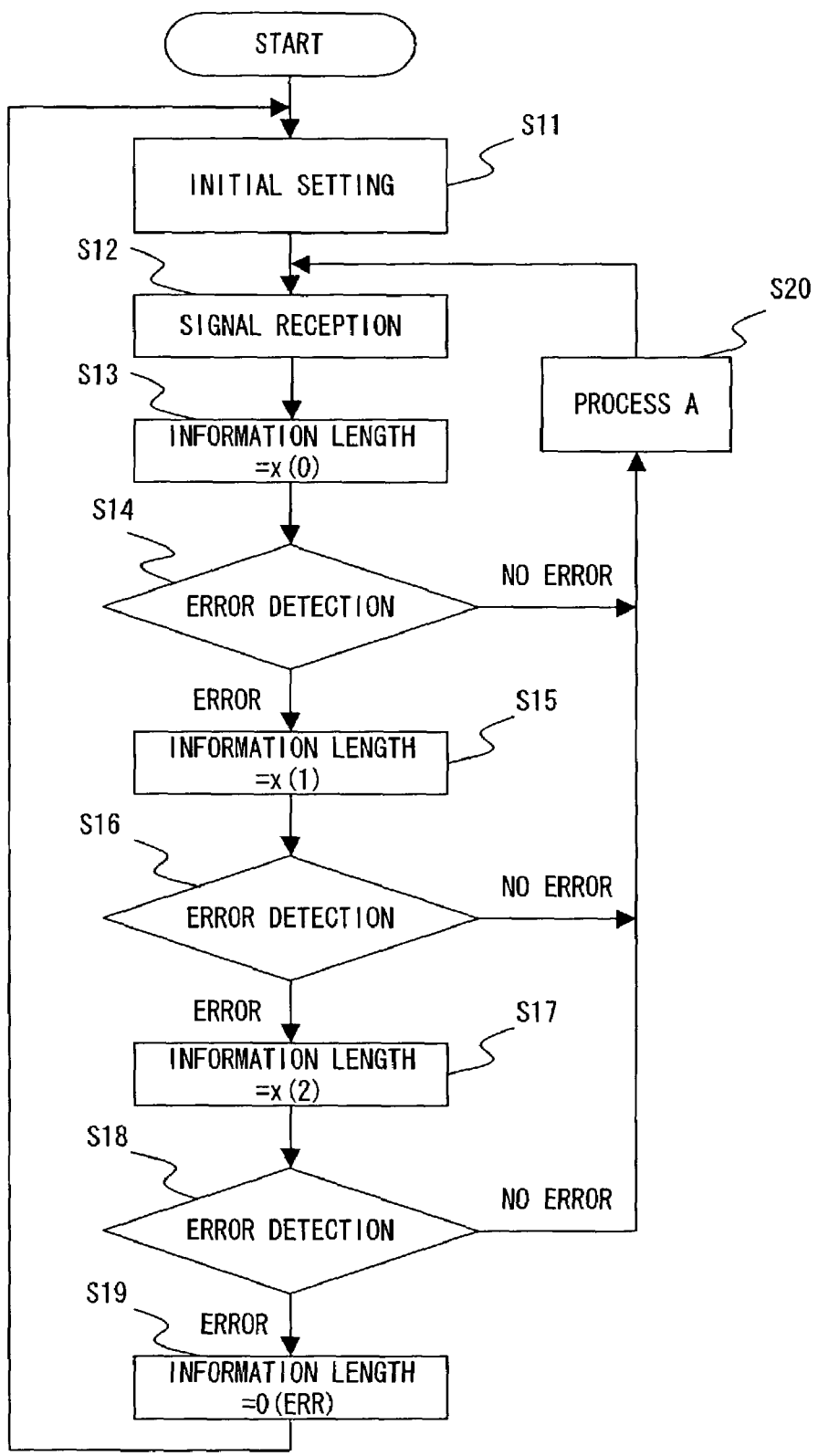
F I G. 3

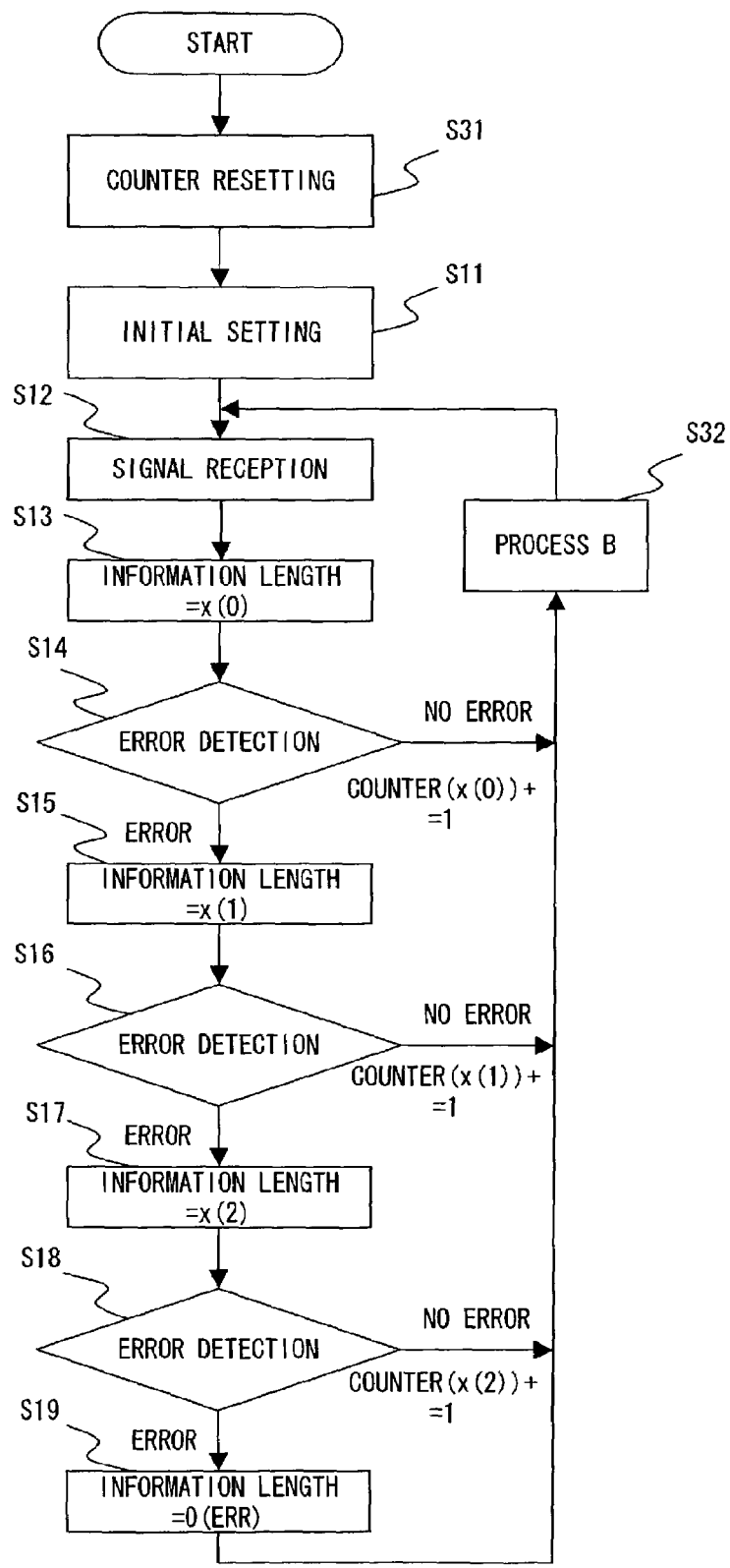
F I G. 4

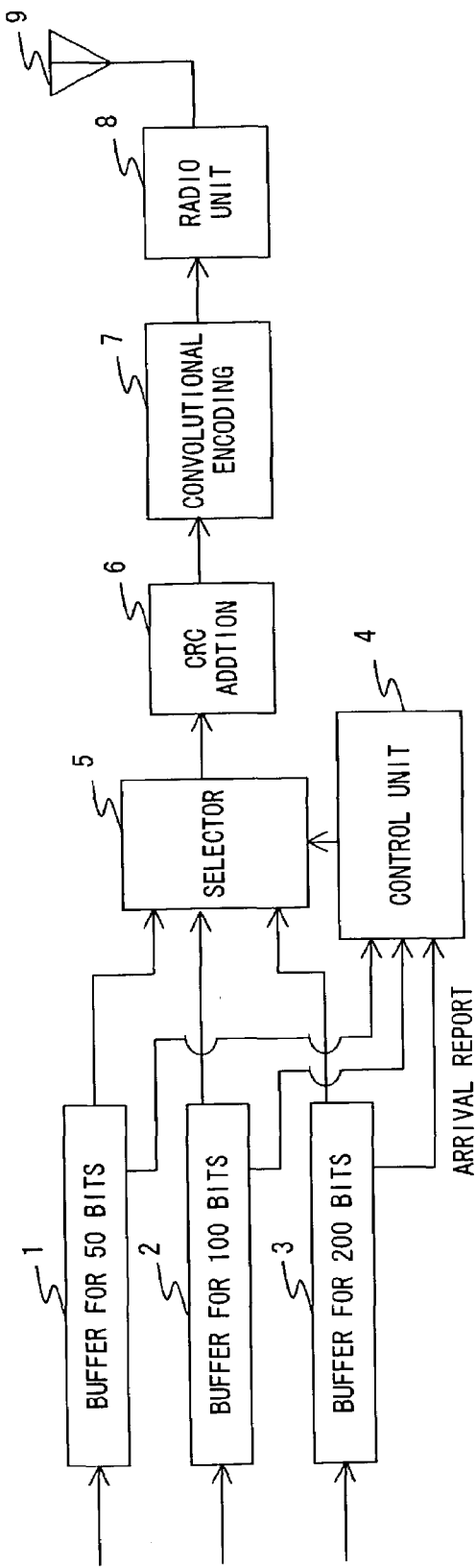
F I G. 5

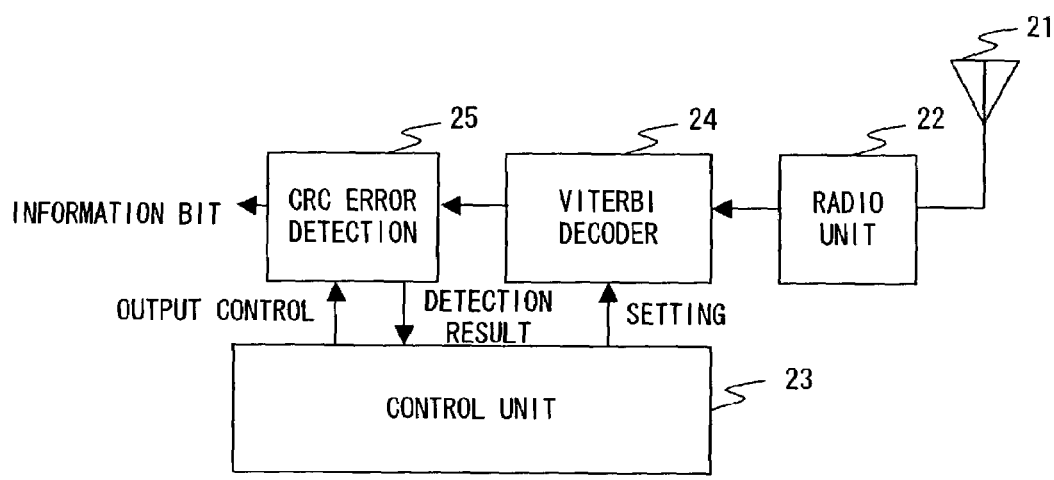
F I G. 7

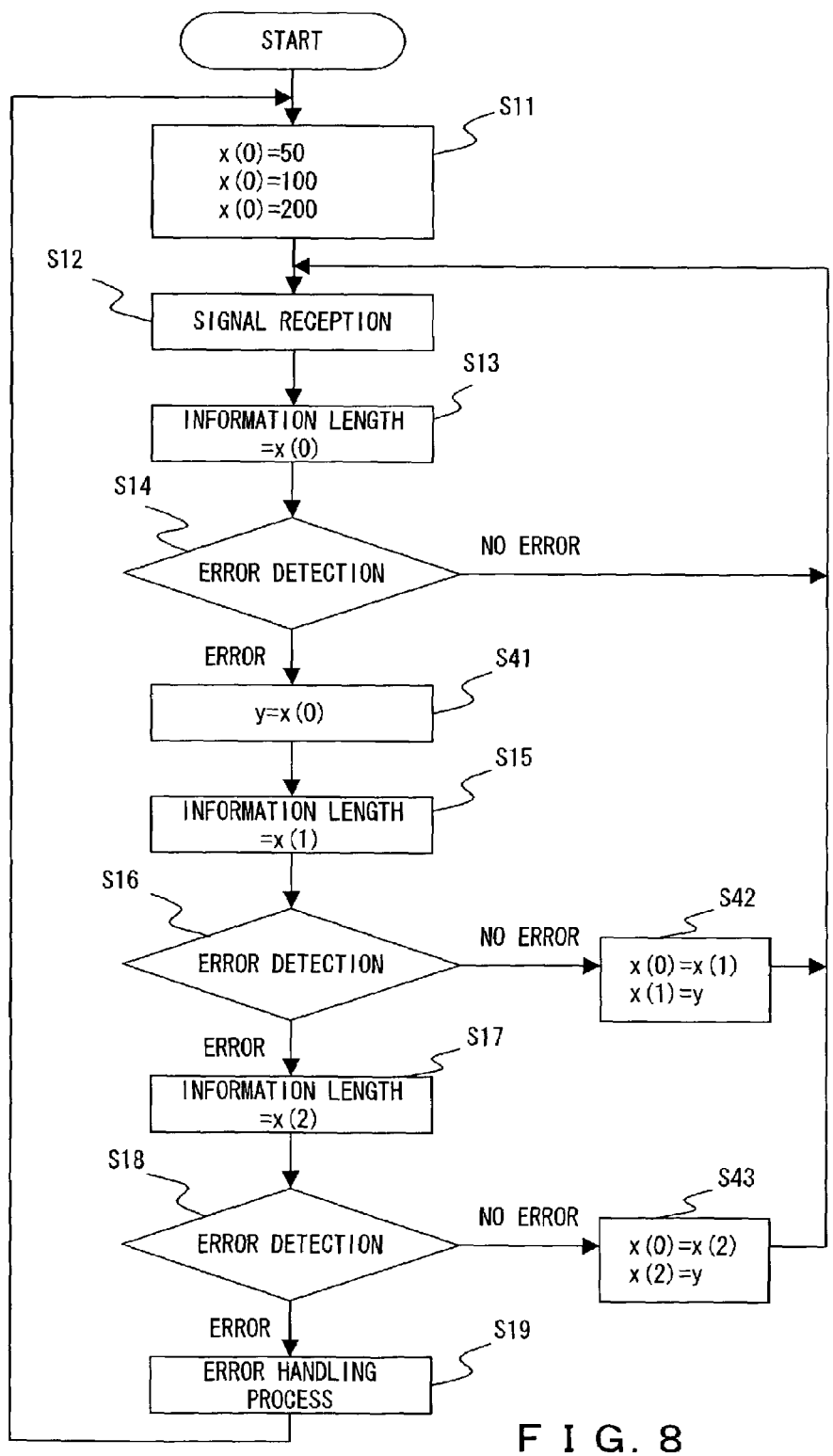
F I G. 8

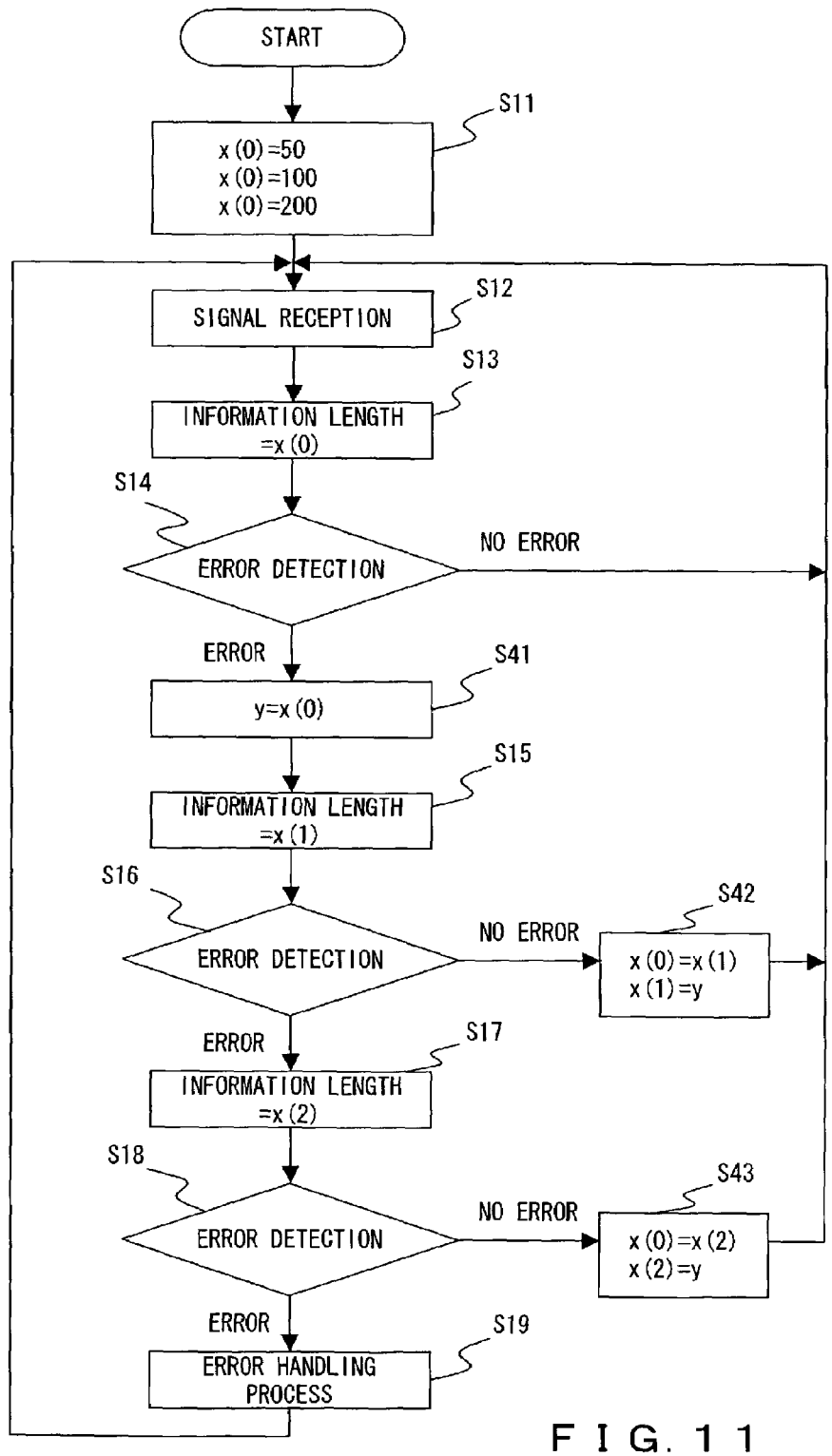
F I G. 1 1

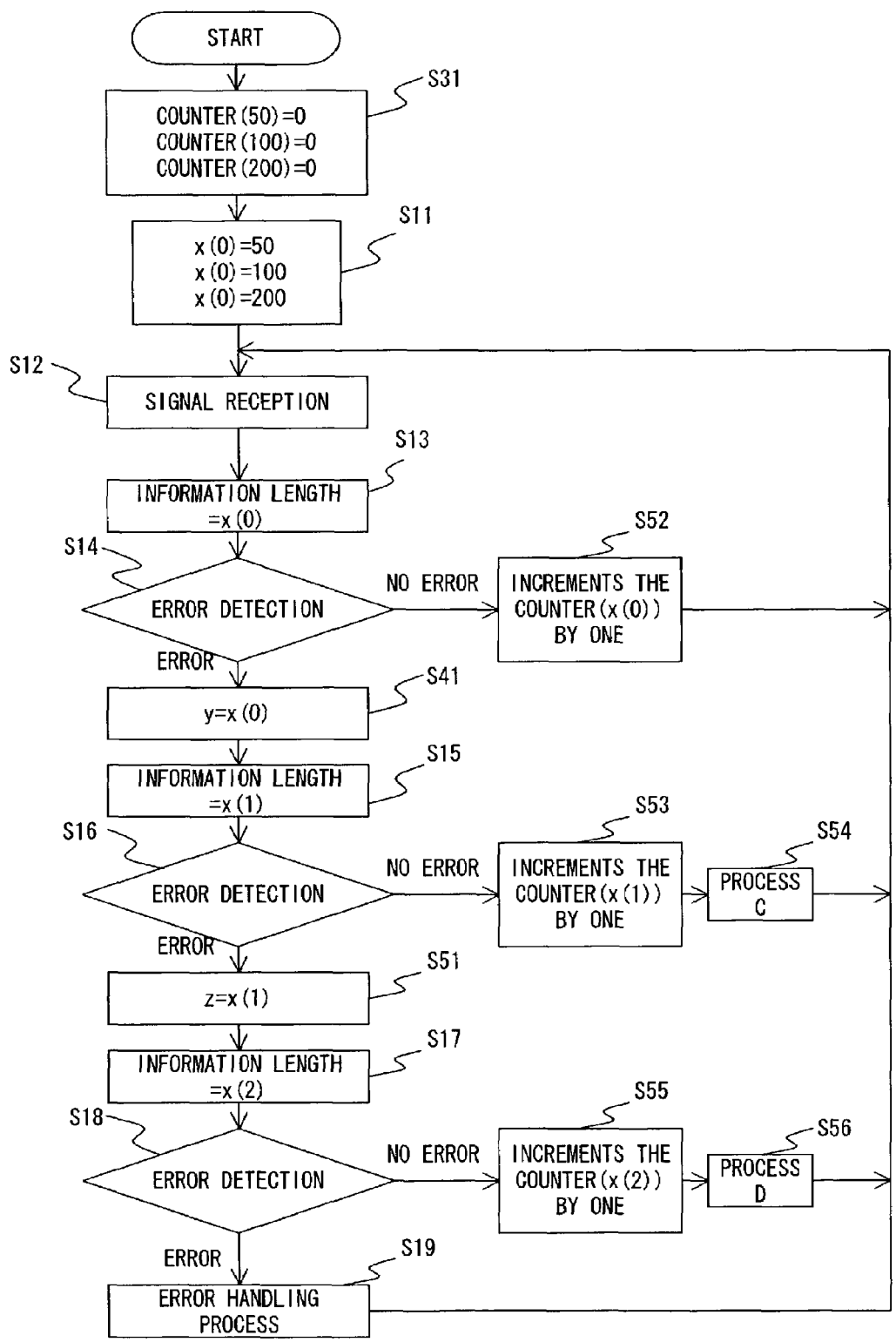
F I G. 1 3

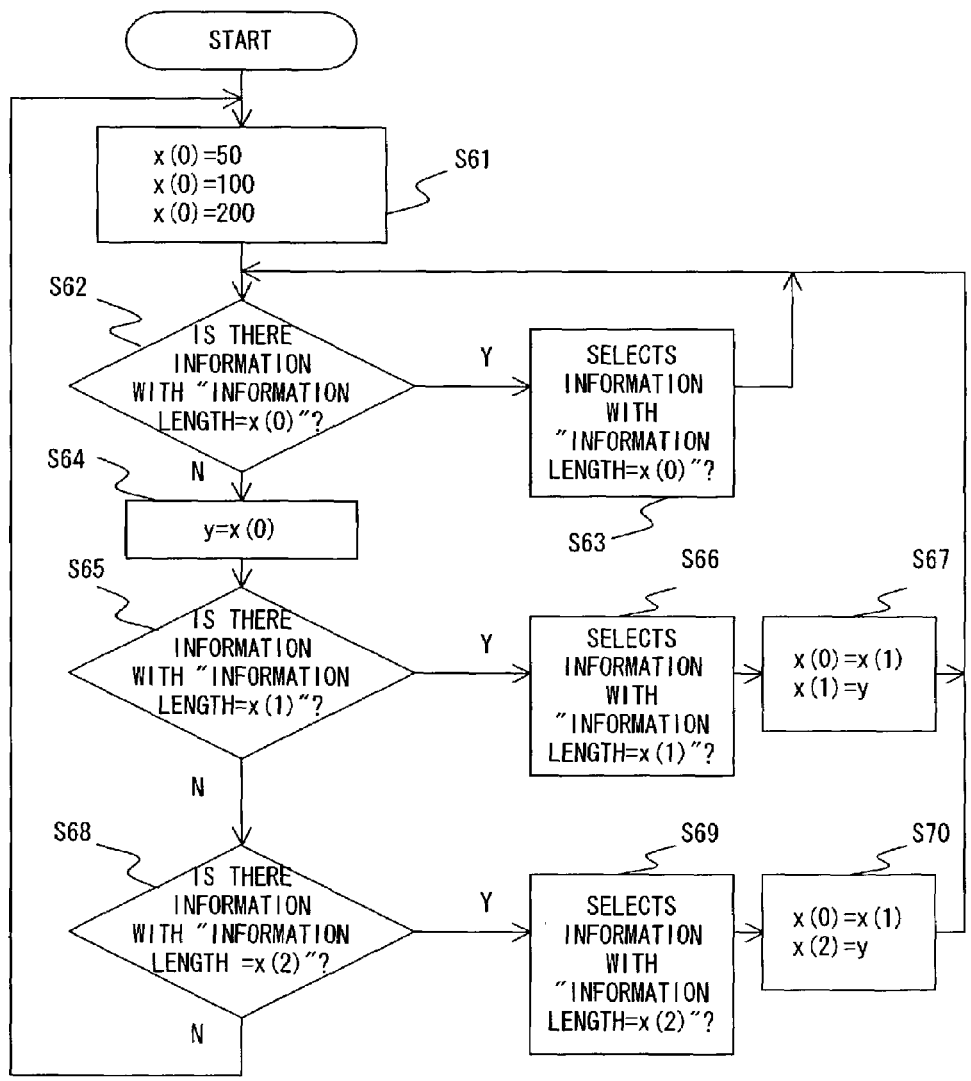
F I G. 1 6

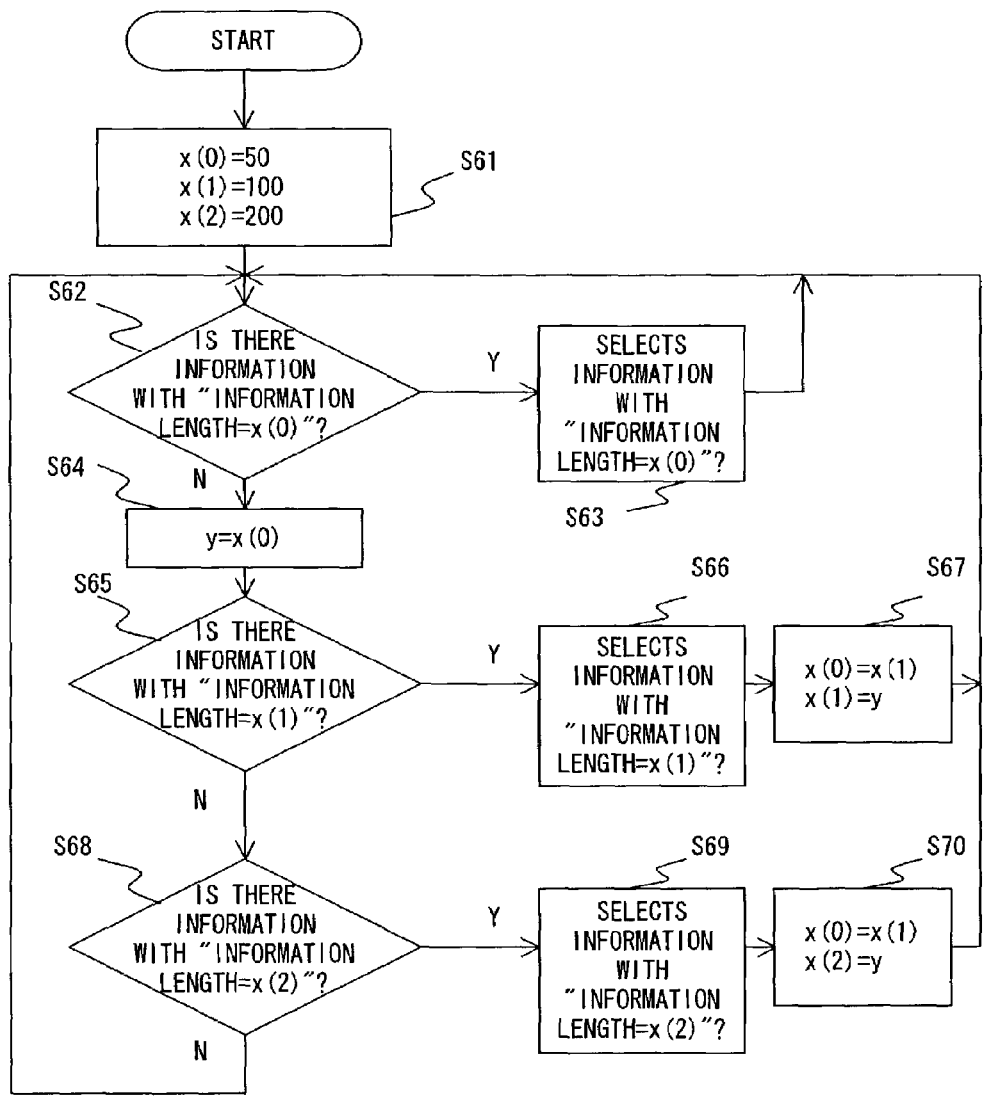
F I G. 1 7

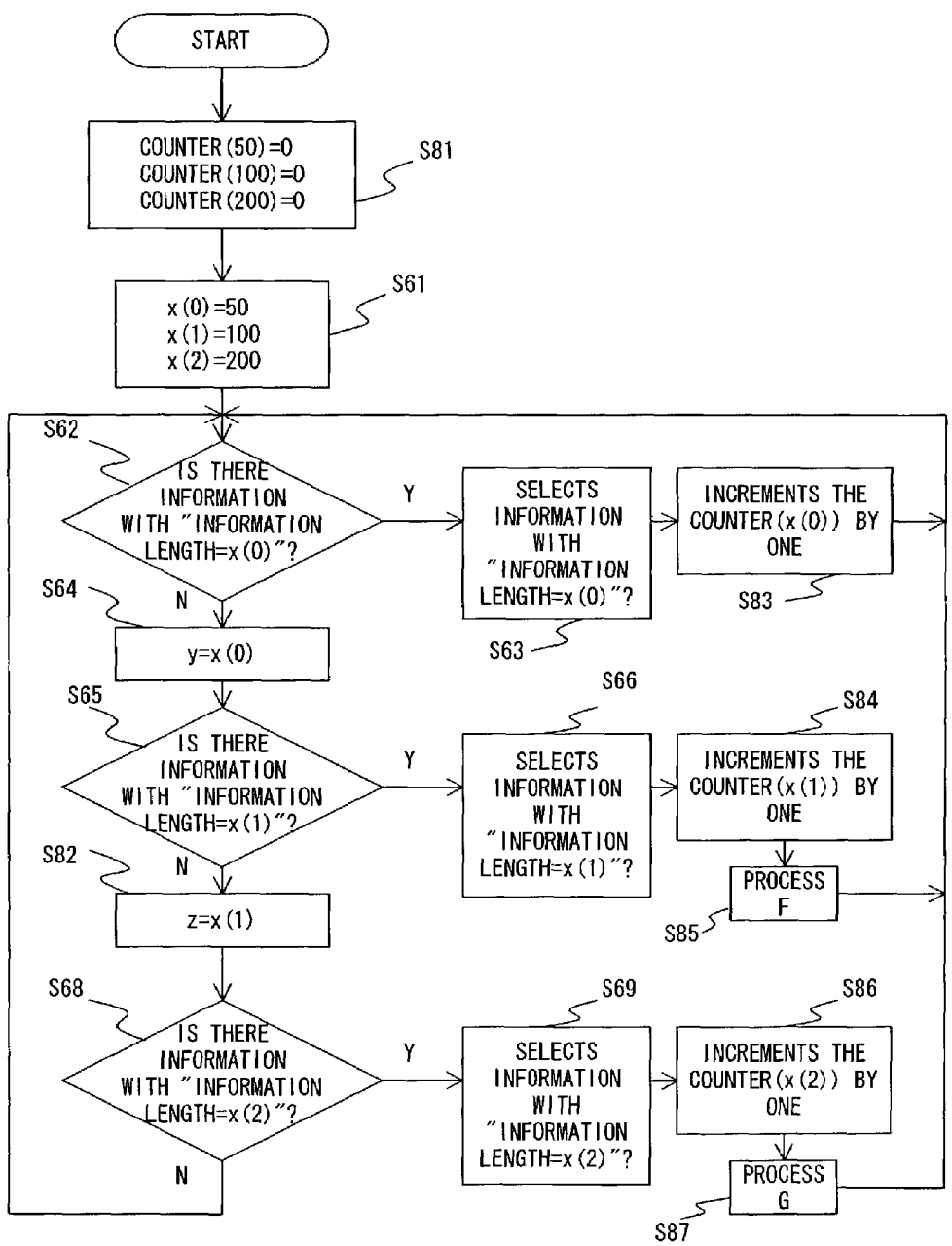
F I G. 1 8

| MODE | TOTAL | CLASS A | CLASS B | CLASS C |
|---|---|---|---|---|
| AMR12.2 | 244 | 81 | 103 | 60 |
| AMR10.2 | 204 | 65 | 99 | 40 |
| AMR7.95 | 159 | 75 | 84 | 0 |
| AMR7.4 | 148 | 61 | 87 | 0 |
| AMR6.7 | 134 | 58 | 76 | 0 |
| AMR5.9 | 118 | 55 | 63 | 0 |
| AMR5.15 | 103 | 49 | 54 | 0 |
| AMR4.75 | 95 | 42 | 53 | 0 |
| SID-UPDATE | 35 | 35 | 0 | 0 |

F I G. 2 0

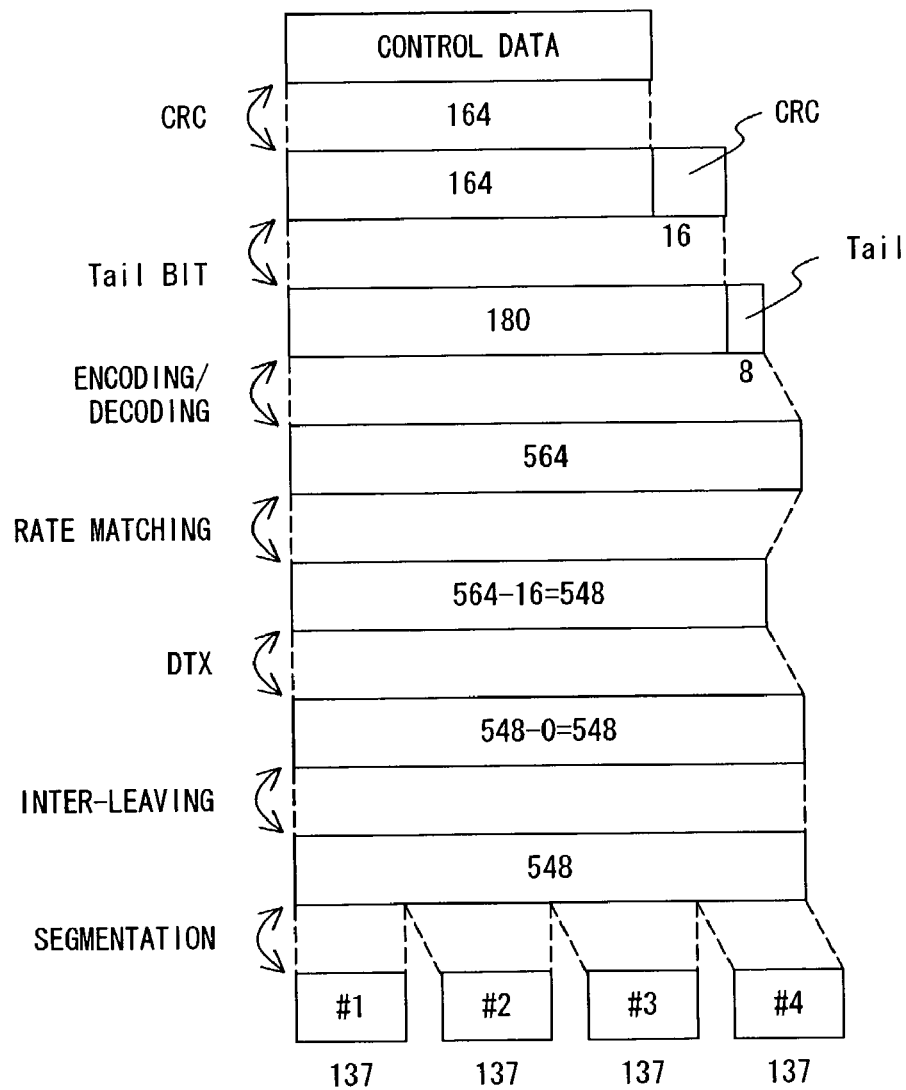
F I G. 2 2

TRANSMISSION FORMAT DETECTION METHOD

CROSS REFERENCE TO RELATED APPLICATION

This application is a continuation of an international application of PCT/JP00/04059, which was filed on Jun. 21, 2000.

BACKGROUND OF THE INVENTION

1. Field of the Invention

The present invention relates to a communication system in which the amount (number of bits or length) of information stored in a transmission frame can dynamically vary for each transmission frame.

2. Description of the Related Art

Recently, mobile communications have rapidly spread and a variety of communication methods have been proposed and developed. One next-generation cellular phone system (IMT-2000), W-CDMA (Wideband-Code Division Multiplex Access) is proposed.

In W-CDMA, a variety of new technologies are introduced to facilitate a high transferrate, increasing number of users, effective use of the radio band. A technology called "BTFD (Blind Transport Format Detection)" is one such newly-adopted technology.

A system adopting BTFD can dynamically change the data rate while transmitting information. Specifically, while information is stored in a frame and transmitted, the number of information bits (that is to say, information length) in a frame can be changed for each frame. In this case, a transmitter does not notify a receiver of the information length of a frame. Therefore, when obtaining information from a received frame, the receiver must detect the information length of the frame.

FIG. 1 shows an example format of a transmission frame used in BTFD. A CRC (Cyclic Redundancy Code) is appended to each piece of information to be transmitted (information bits), and error correction encoding is applied to the information. The error correction code is, for example, a convolutional code. Then, the encoded data is stored in a transmission frame and is transmitted over a network. In the following description, a transmission frame transmitted over a radio network is sometimes called a "radio frame". Basically, the length of a radio frame is fixed. Therefore, when encoded data is stored in a radio frame, DTX (Discontinuous Transmission) is set, if necessary, in order to meet the space requirements of the data area of the radio frame. "DTX" means not to transmit a signal.

In this way, in BTFD, the information length of each radio frame can be changed for each frame. Then, the receiver detects the information length on receipt of the transmitted information.

FIG. 2 is a flowchart showing the general algorithm of BTFD, which is executed by a receiver. It is assumed here that the system uses the three information lengths shown in FIG. 1 (50 bits, 100 bits and 200 bits).

On receiving a signal (radio frame) in step S1, the process for detecting the information length of the radio frame is started. In steps S2 and S3, error detection is performed assuming that the information length of the received radio frame is 50 bits. This error detection is, for example, a CRC operation. In step S3, if no error is detected, it is judged that the information length of the received radio frame is 50 bits, and the 50 bits of information are obtained. If an error is detected in step S3, the flow proceeds to step S4.

In steps S4 and S5, error detection is performed assuming that the information length of the received radio frame is 100 bits. In step S5, if no error is detected, it is judged that the information length of the received radio frame is 100 bits, and the 100 bits of information are obtained. If an error is detected in step S5, the flow proceeds to step S6.

In steps S6 and S7, error detection is performed assuming that the information length of the received radio frame is 200 bits. In step S7, if no error is detected, it is judged that the information length of the received radio frame is 200 bits, and the 200 bits of information are obtained. However, if an error is detected in step S7, it is judged that an error in the transmission line occurs, and a process corresponding to the error is performed in step S8.

In this way, in a communication system adopting BTFD, a receiver detects the information length of a radio frame every time a frame is received and it obtains the information accordingly. As described above, in existing BTFD, when an error detection process with a prediction of an information length of received frame is repeated, the order of the predicted information length used in the error detection process is fixed.

For a detailed description of BTFD, see for example 3rd Generation Partnership Project; Technical Specification Group Radio Access Network, Multiplexing and channel coding (3G TS 25.212 version 3.1.0).

If the algorithm shown in FIG. 2 is adopted, an error detection process is performed only once when 50 bits of information are stored and transmitted in a radio frame. However, if 100 bits of information are stored and transmitted in a radio frame, the error detection process is performed twice, and if 200 bits of information are stored and transmitted in a radio frame, the error detection process is performed three times. Therefore, in this case, the average number of times that the error detection process will be performed is twice per radio frame.

However, before performing this error detection, generally, error correction decoding, in which the operation amount is large, must be performed. Therefore, if the number of times that the error detection process is performed increases, it requires a longer processing time and a larger amount of power. As a result, it is advantageous to minimize the number of times that the error detection process is performed.

Although in the above example, it is assumed that the system uses three kinds of information lengths, it follows that the average number of executions of the error detection process will increase, as the number of information lengths increase.

SUMMARY OF THE INVENTION

The object of the present invention is to reduce the amount of processing needed to detect the amount of information received in a communication system in which the amount of information can vary for each frame. More specifically, the object of the present invention is to reduce the operation amount performed in BTFD applied to W-CDMA and thereby to reduce power consumption.

The transmission format detection method of the present invention detects an information length of a frame in a communication system that transmits frames storing information, comprises; generating a predicted value which predicts an information length of a relevant frame based on an information length of a frame received before; performing an error detection process on the relevant frame using the generated predicted value; and detecting the information length of the relevant frame based on the result of the error detection process.

According to this method, in a communication system having a specific tendency to use a given information length, an error detection process can be efficiently performed by utilizing the previous detection results, and thereby a number of execution of the error detection process is reduced.

In this method, the information length can, for example, be predicted based on the information length of an immediately previous frame. By predicting the information length in this way, the efficiency of an error detection process is improved, when frames with identical information length are consecutively transmitted.

The format detection method, in another aspect of the present invention, detects the information length of a frame in a communication system that transmits frames storing information, comprises; detecting an information length of each of a plurality of frames; checking a detected frequency for each information length; performing an error detection process assuming that information with one of the detected information length is stored in a relevant frame according to the detected frequencies; and detecting an information length of the relevant frame based on a result of the error detection process.

According to this method, the efficiency of error detection is improved, especially in a communication system that frequently transmits frames of a specific information length.

BRIEF DESCRIPTION OF THE DRAWINGS

FIG. 3 is a flowchart showing the BTFD algorithm of the present invention.

FIG. 4 is a flowchart showing the BTFD algorithm in another aspect of the present invention.

FIG. 5 shows a transmitter used in a communication system to which the present invention is applied.

FIG. 7 shows a receiver used in a communication system to which the present invention is applied.

FIG. 8 is a flowchart showing the first embodiment of the BTFD algorithm of the present invention.

FIG. 11 is a flowchart showing the second embodiment of the BTFD algorithm of the present invention.

FIG. 13 is a flowchart showing the third embodiment of the BTFD algorithm of the present invention.

FIG. 16 is a flowchart showing the first embodiment of the operation of a transmitter.

FIG. 17 is a flowchart showing the second embodiment of the operation of a transmitter.

FIG. 18 is a flowchart showing the third embodiment of the operation of a transmitter.

FIG. 20 explains communication modes used in W-CDMA.

FIG. 22 shows the disassembly/assembly of control data.

DESCRIPTION OF THE PREFERRED EMBODIMENTS

Figure 1:
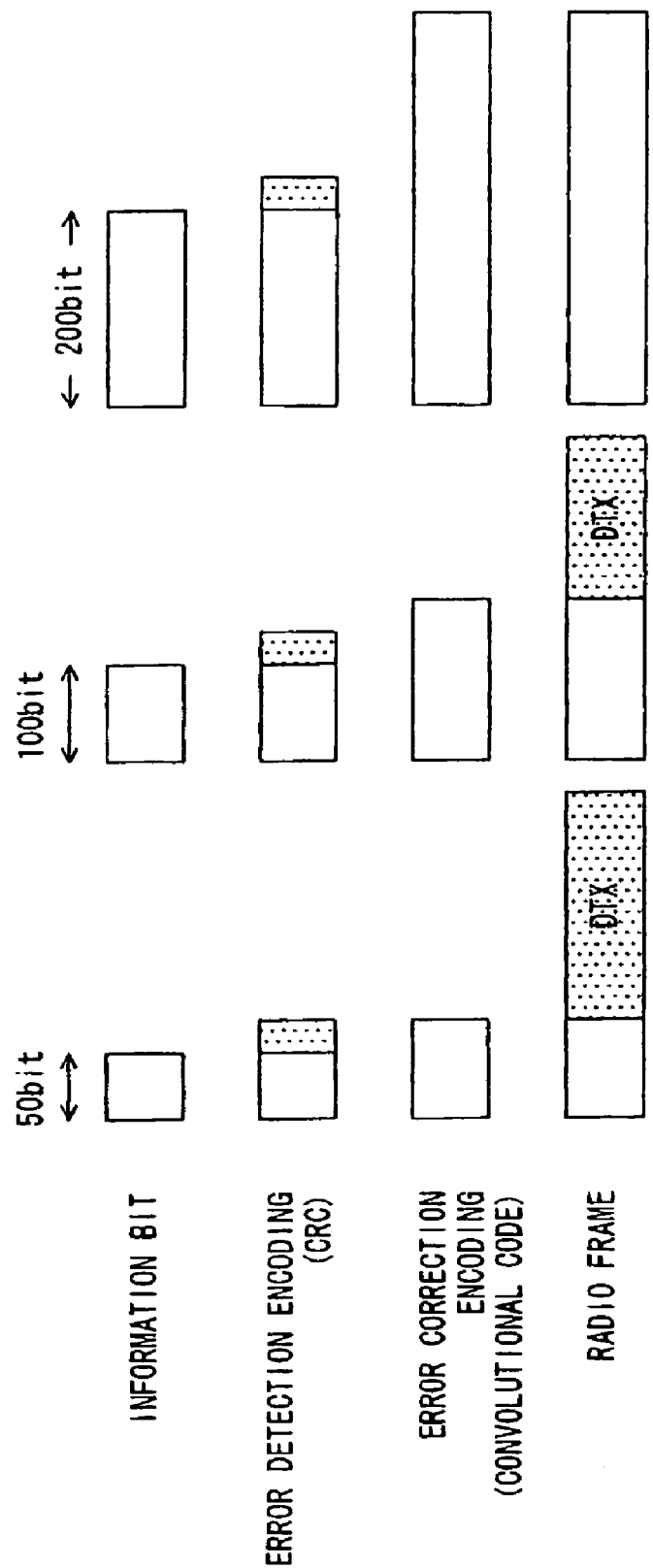
FIG. 1 shows an example format of a conventional transmission frame used in BTFD.

The embodiments of the present invention are described below. First, the basic BTFD algorithm of the present invention is described.

FIG. 3 is a flowchart showing the BTFD algorithm of the present invention. As in the example shown in FIG. 2, it is assumed that a transmission frame can store 50 bits of information, 100 bits of information and 200 bits of information.

The BTFD algorithm of the present invention predicts the information length of a transmission frame and performs an error detection process based on the prediction. Specifically, a receiver predicts whether the information length of a transmission frame is 50 bits, 100 bits or 200 bits, and performs the error detection process on information with the predicted information length.

In this example, the first, second and third predicted values are used. The first, second and third predicted values are stored in memory areas $x(0)$, $x(1)$ and $x(2)$, respectively. Since in this example, transmission frames can store information with one of three lengths, the first through third predicted values are used. However, if transmission frames can store information with one of N lengths, N predicted values are used.

In step S11, the initial setting of the predicted values are made. In this case, for example, "50 bits", "100 bits" and "200 bits" are set in the memory areas $x(0)$, $x(1)$ and $x(2)$ as the first, second and third predicted values, respectively.

Then, a signal (transmission frame) is received in step S12, and the first predicted value is extracted from the memory area $x(0)$ in step S13. In this case, the first predicted value is "50 bits". Therefore, in step S14, an error detection process is performed assuming that 50 bits of information are stored in a prescribed position of the received transmission frame. Then, if no error is detected, it is judged that the information length of the transmission frame coincides with the first predicted value (50 bits). In this case, the flow proceeds to step S20 and Process A is performed. The content of "Process A" is described later. If an error is detected in step S14, it is judged that the information length of the transmission frame does not coincide with the first predicted value, and the flow proceeds to step S15.

In step S15, the second predicted value is extracted from the memory area $x(1)$. In this case, the second predicted value is "100 bits". Therefore, in step S16, the error detection process is performed assuming that 100 bits of information are stored in the received transmission frame. Then, if no error is detected, it is judged that the information length of the transmission frame coincides with the second predicted value (100 bits), and the flow proceeds to step S20. However, if an error is detected, the flow proceeds to step S17.

Similarly, in step S17, the third predicted value is extracted from the memory area x(2). In this case, the third predicted value is "200 bits". Therefore, in step S18, the error detection process is performed assuming that 200 bits of information are stored in the received transmission frame. Then, if no error is detected, it is judged that the information length of the transmission frame coincides with the third predicted value (200 bits), and the flow proceeds to step S20. However, if an error is detected, it is judged that some kind of transmission error occurs and the flow proceeds to step S19. In step S19, a signal indicating that the information length of the transmission frame cannot be detected is generated.

In this way, by the processes in steps S13 through S18, the information length of a transmission frame can be detected.

In step S20, process A, the records of the memory areas x(0), x(1) and x(2) are updated with the results of the error detection processes in steps S14, S16 and S18. Specifically, the information length of a received transmission frame is written in the memory area x(0). Here, as described above, the processes in steps S13 through S18 detect the information length of the relevant transmission frame. For example, if no error is detected in step S14, the information length of the transmission frame coincides with the first predicted value. If no error is detected in step S16, the information length of the transmission frame coincides with the second predicted value. Specifically, for example, in a state where "50 bits", "100 bits" and "200 bits" are set in the memory areas x(0), x(1) and x(2), respectively, and if an error is detected in step S14 and no error is detected in step S16, then it is judged that 100 bits of information are stored in the transmission frame, and "100 bits" is written in the memory area x(0). At this time, either "50 bits" or "200 bits" is written in the memory area x(1), and "200 bits" or "50 bits" is written in the memory area x(2).

In this way, in process A, the information length of a received transmission frame is written in the memory area x(0) as the first predicted value of the next error detection process. Therefore, when a transmission frame is received, the information length of a previous (or immediately previous) transmission frame is set as the first predicted value. In other words, according to the BTFD algorithm of the present invention, when a transmission frame is received, the error detection process is performed using the information length of a previous transmission frame as the predicted value. Then if the prediction fails, the error detection process using another predicted value is performed.

The BTFD algorithm described above is efficient in a communication system where the information length of transmission frames seldom varies or identical information length is often consecutively used. For example, it is assumed that when ten frames are transmitted and information lengths of the frames vary only once. Specifically, it is assumed that five consecutive transmission frames with 50 bits of information are transmitted, and then five consecutive transmission frames with 100 bits of information are transmitted. In this case, when a transmission frame with 50 bits of information is received, "50 bits" is set as the first predicted value. Therefore, during this period, since the information length of the transmission frame coincides with the first predicted value, if there is no transmission error, then it is judged that there is "no error" in step S14 of the flowchart shown in FIG. 3, and the "information length=50" is detected. In this case, steps S14 through S18 are not executed. In short, when a transmission frame storing 50 bits of information is received, the error detection process is performed only once.

After these five frames, transmission frames storing 100 bits of information are received. Here, at this time when a first transmission frame storing 100 bits of information is received, "50 bits" is set as the first predicted value. In this case, since the information length of this transmission frame, 100 bits, does not coincide with the first predicted value, 50 bits, therefore, "error" is detected in step S14. Then, following the flowchart, step S16 is executed. In this case, if "100 bits" is set as the second predicted value, then it is judged that there is "no error" in step S16, and the "information length=100" is detected. In this way, when the information lengths of two consecutive transmission frames differ, the error detection process is performed twice. In this example, if "200 bits" and "100 bits" are set as the second and third predicted values, the error detection process is performed three times when receiving the first transmission frame storing 100 bits of information.

When the "information length=100" is detected, "100 bits" is set as the first predicted value. Therefore, subsequently, while transmission frames storing 100 bits of information are received, the information length of the transmission frame coincides with the first predicted value, it is judged that there is "no error" in step S14, and the "information length=100" is detected. That is to say, during this period, the error detection process is performed only once per transmission frame.

In the above example, the error detection process is performed a total of eleven times while ten transmission frames are received. That is, the error detection process is performed an average of "1.1" times per transmission frame. As a result, the error detection process is performed fewer times when using the BTFD algorithm shown in FIG. 3, than when using the existing BTFD algorithm shown in FIG. 2. This advantage becomes more substantial as the number of information lengths used increases.

FIG. 4 is a flowchart showing the BTFD algorithm in another aspect of the present invention. In this example too, it is assumed that a transmission frame can store 50 bits, 100 bits or 200 bits of information as in the example shown in FIG. 2.

Like the algorithm shown in FIG. 3, the algorithm shown in FIG. 4 predicts the information length of a transmission frame and performs error detection based on the prediction. However, according to the algorithm shown in FIG. 4, statistics on the information lengths of previous transmission frames are calculated in advance, and the predicted value is determined based on the number of times it was used. Specifically, for example, if the number of transmission frames storing 50 bits of information is greatest, and the number of transmission frames storing 100 bits of information or 200 bits of information is small, then "50 bits" is set in the memory area x(0) as the first predicted value.

According to the BTFD algorithm shown in FIG. 4, in order to implement the above process, a counter for counting the number of frames received is provided for each information length (number of information bits). In this example, a counter(50), a counter (100) and a counter (200) are provided for 50 bits of information, 100 bits of information and 200 bits of information, respectively.

In step S31, the above counters are reset. The each value of the counter(50), the counter(100) and the counter(200) is set to "0".

Then, steps S11 through S19 are executed. Steps S11 through S19 have already been described with reference to FIG. 3. Specifically, the information length of a transmission frame is detected. However, if no error is detected in step S14, S16 or S18, the counter corresponding to the detected information length is incremented. Here, it is assumed, for example, "50 bits", "100 bits" and "200 bits" are stored in the memory areas x(0), x(1) and x(2), as the first, second and third predicted values, respectively. Then, when a transmission frame storing 50 bits of information is received, "no error" is detected in step S14, and the counter(50) is incremented. In other words, on receipt of a transmission frame, if "information length=50" is detected, then the counter(50) is incremented. Similarly, if a transmission frame storing 100 bits of information is received, then "no error" is detected in step S16, and the counter(100) is incremented. If a transmission frame storing 200 bits of information is received, then "no error" is detected in step S18, and the counter(200) is incremented.

In summary, according to the algorithm shown in FIG. 4, every time a transmission frame is received, a counter corresponding to the information length of the received transmission frame is incremented. In this way, the information length frequencies are counted. After the counters are incremented, process B is performed in step S32.

In step S32, process B, the value of each counter is checked and the predicted values are arranged in descending order of their respective value. For example, if transmission frames storing 100 bits of information have been received the most, transmission frames storing 50 bits of information has been received less and transmission frames storing 200 bits of information have been received the least, then "100 bits", "50 bits" and "200 bits" are set in the memory areas x(0), x(1) and x(2), as the first, second and third predicted values, respectively.

In this way, in process B, the information length received most often is written in the memory area x(0) as the first predicted value. On receipt of a transmission frame, an error detection process is performed assuming that an information length of the received transmission frame is equal to the information length which has been detected most often. Therefore, according to this BTFD algorithm, there is a high probability that the information length of a received transmission frame may coincide with the predicted value in the first error detection process (step S14). That is to say, there is a high probability that the information length of a received transmission frame can be detected in the first error detection process in this algorithm. As a result, the total or average number of times the error detection process is executed is reduced.

The above BTFD algorithm is efficient in a communication system where a specific information length is frequently used. For example, if the percentage of frames which store 50 bits of information, 100 bits of information and 200 bits of information are 60 percents, 30 percents and 10 percents, respectively, then "50 bits", "100 bits" and "200 bits" are set as the first, second and third predicted value, respectively. In this case, on receipt of a transmission frame storing 50 bits of information, the information length is detected in the first error detection process; on receipt of a transmission frame storing 100 bits of information, the information length is detected in the second error detection process; and on receipt of a transmission frame storing 200 bits of information, the information length is detected in the third error detection process. In other words, the probabilities that the information length can be detected by performing one, two and three error detection processes are 60 percents, 30 percents and 10 percents, respectively. In this example, in order to determine the information length of a transmission frame, the average execution time of the error detection process will be as follows.

$$1 \times 0.6 + 2 \times 0.3 + 3 \times 0.1 = 1.5 \text{ times}$$

Figure 2:
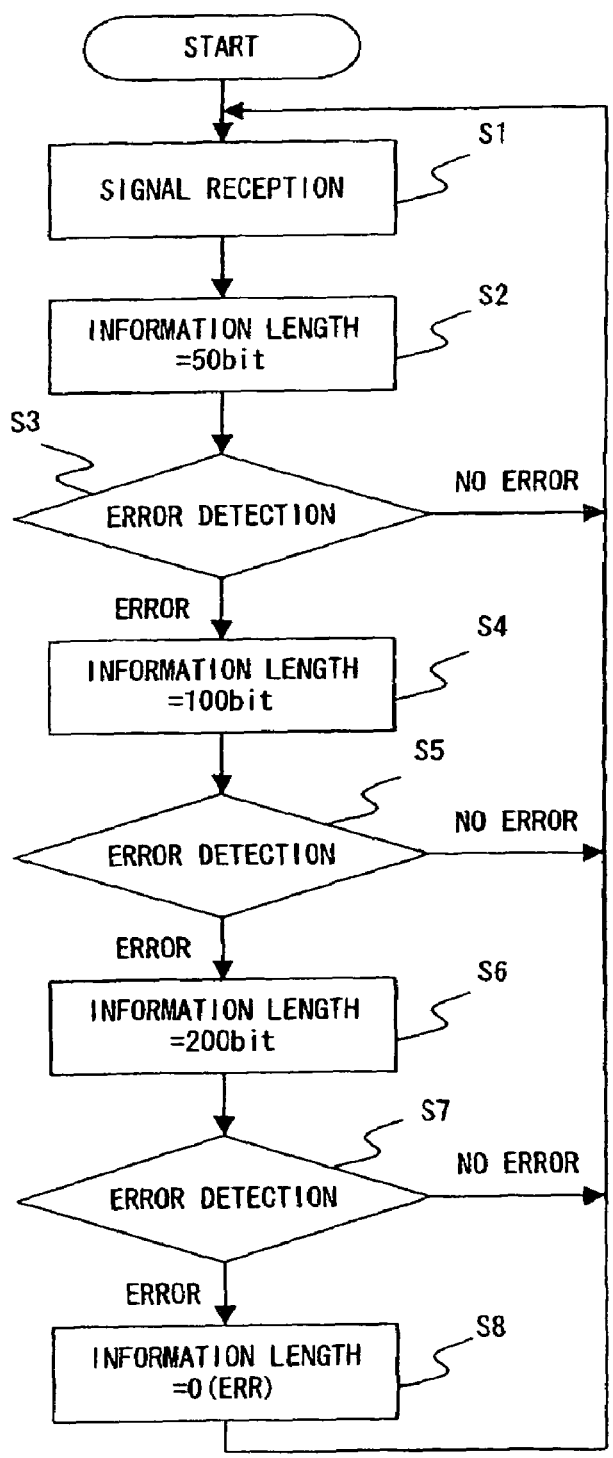
FIG. 2 is a flowchart showing the conventional general algorithm of existing BTFD.

As a result, the error detection process is executed fewer times when using the BTFD algorithm shown in FIG. 4, than when using the existing BTFD algorithm shown in FIG. 2. This advantage becomes more substantial as the number of information lengths used increases.

Next, the embodiments of the present invention are described. Here, a case where a receiver of a radio communication system adopts the BTFD algorithm of the present invention is used as an example. The communications method is, in this example, assumed to be CDMA using a convolutional code. It is also assumed that 50 bits of information, 100 bits of information and 200 bits of information can be transmitted.

FIG. 5 shows a transmitter used in a system to which the present invention is applied. This configuration shows only functions directly related to the present invention; a function to generate data and a function to receive signals are omitted. It is also assumed that the communication system of this embodiment is a radio network.

Buffers 1 through 3 store 50 bits of information, 100 bits of information and 200 bits of information, respectively. In other words, information to be transmitted is segmented into units of 50 bits, 100 bits or 200 bits, and is stored in a corresponding buffer.

A control unit 4 gives a selecting instruction to a selector 5 depending on the amount of information stored in each of the buffers 1 through 3 or according to an arrival report from the buffers 1 through 3. This arrival report is information indicating whether each buffer stores information.

The selector 5 selects the data in one of the buffers 1 through 3 according to a selecting instruction from the control unit 4. By this selection, 50 bits of information, 100 bits of information or 200 bits of information is provided for a CRC addition unit 6.

The CRC addition unit 6 appends a CRC to the information selected by the selector 5. It is assumed that the number of bits in a CRC is constant. Since CRC itself is a known technology, the description about it is omitted. A convolutional encoding unit 7 performs the convolutional encoding process on the output of the CRC addition unit 6. A radio unit 8 stores the output of the convolutional encoding unit 7 in a radio frame (frame to be transmitted in a radio network). This radio frame is transmitted through an antenna 9.

Figure 6:
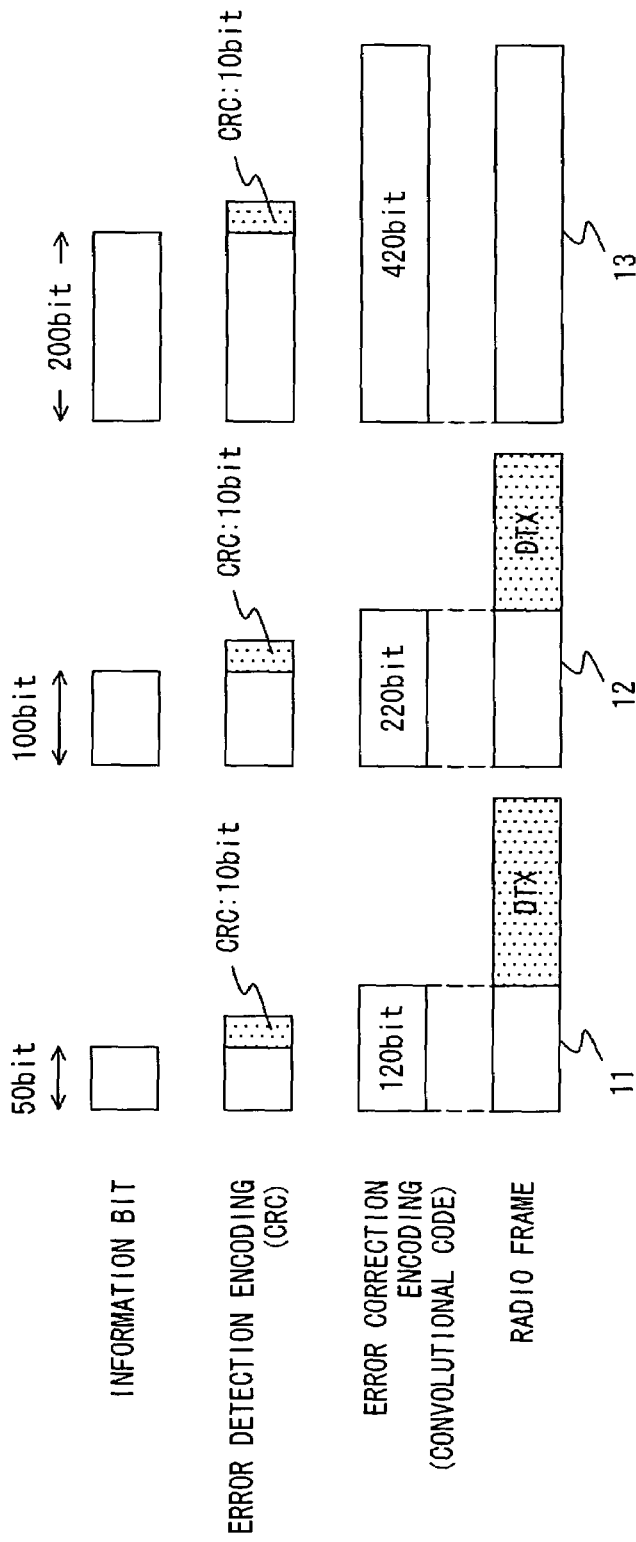
FIG. 6 shows example structures of radio frames generated by the transmitter shown in FIG. 5.

FIG. 6 shows example structures of radio frames generated by the transmitter. In this example, it is assumed that a CRC of 10 bits is appended to the information regardless of the information length. It is also assumed that the encoding ratio of the convolutional encoding unit 7 is "1:2".

If the selector selects 50 bits of information, CRC of 10 bits is appended to the information and the information is encoded, resulting in 120 bits of encoded data. By storing this encoded data in a frame, a radio frame 11 is generated. Similarly, if 100 bits of information are selected, 220 bits of encoded data are generated, and by storing the encoded data in a frame, a radio frame 12 is generated. In addition, if 200 bits of information are selected, 420 bits of encoded data are generated, and by storing the encoded data in a frame, a radio frame 13 is generated.

FIG. 7 shows a receiver used in a communication system to which the present invention is applied. This receiver receives the radio frames 11 through 13 transmitted by the transmitter shown in FIG. 5 and obtains information bits from those radio frames. FIG. 7 shows only functions directly related to the present invention.

An antenna 21 receives radio signals. Then, a radio unit 22 terminates the radio frame.

A control unit 23 predicts the information length of the radio frame and provides the predicted value to a Viterbi decoder 24. The control unit 23 also judges whether a next predicted value should be provided to the Viterbi decoder 24, based on the detection result of a CRC error detection unit 25.

The Viterbi decoder 24 regenerates or extracts encoded data from the radio frames using the predicted value provided by the control unit 23 and decodes the encoded data. The CRC error detection unit 25 performs the CRC operation on the data decoded by the Viterbi decoder 24 and judges whether there is an error. This detection result is provided to the control unit 23.

If no error is detected in the CRC operation, the control unit 23 outputs the decoded data obtained by the Viterbi decoder 24 as information bits transmitted by the transmitter. If an error is detected in the CRC operation, the control unit 23 provides a next predicted value to the Viterbi decoder 24.

The operation of this receiver is described below. As described with reference to FIG. 3, the first through third predicted values are set in the control unit 23 of the receiver. On receipt of a radio frame via the radio unit 22, the control unit 23 provides the first predicted value to the Viterbi decoder 24. In this example, it is assumed that "50 bits" is provided as the first predicted value.

On receipt of the first predicted value, the Viterbi decoder 24 regenerates/extracts N bits of data from the received radio frame, where "N" corresponds to the predicted value. For example, if "50 bits" is provided as the first predicted value, 120 bits of data are extracted from the radio frame. The receiver recognizes that the CRC is 10 bits and the encoding ratio in the transmitter is "1:2".

Then, the Viterbi decoder 24 decodes the extracted 120 bits of data, and then the CRC operation is performed on the decoded data. At this time, if the radio unit 22 receives the radio frame 11 shown in FIG. 6, no error is detected in the CRC operation. In this case, 50 bits of information are obtained and outputted by deleting the 10 bits of CRC from the decoded data. These are the information bits that were outputted by the transmitter.

On the other hand, when the radio unit 22 receives the radio frame 12 or 13 shown in FIG. 6, and if the 120 bits of data are regenerated/extracted from the radio frame and both of the decoding process and CRC operation are performed on the data, an error will be detected. In this case, the CRC error detection unit 25 notifies the control unit 23 of the error in the CRC operation.

On receipt of this notice, the control unit 23 provides the second predicted value to the Viterbi decoder 24. Then, the Viterbi decoder 24 regenerates/extracts N bits of data from the radio frame, where N corresponds to the second predicted value. For example, if "100 bits" is provided as the second predicted value, 220 bits of data are regenerated/extracted from the radio frame, and if "200 bits" is provided as the second predicted value, 420 bits of data are regenerated/extracted from the radio frame. Any subsequent operation is basically the same as the operation in the case where the first predicted value is provided.

When these processes detect the information length of the radio frame, the control unit 23 updates the first through third predicted values based on the detection result. For example, if the method shown in the flowchart in FIG. 3 is used, the information length stored in the relevant radio frame is set as the first predicted value for the next radio frame. Then, this first predicted value is firstly provided to the Viterbi decoder 24 on receipt of the next radio frame.

Next, specific embodiments are described. FIG. 8 is a flowchart showing the first embodiment of the BTFD algorithm of the present invention. This embodiment is based on the algorithm shown in FIG. 3. Among the step numbers used in FIG. 8, the same numbers as those used in FIG. 3 represent the same processes.

In the first embodiment, the information length of a received radio frame is set as the first predicted value in a process for detecting the information length of the next radio frame. In other words, on receipt of a radio frame, first, the information length detection process is performed assuming that the information length of a current radio frame is the same as the information length of the previous radio frame. Then, if the trial fails, another predicted value is used.

Specifically, according to the algorithm of the first embodiment, steps S42 and 43 are executed as step S20 (process A) shown in FIG. 3. Step S41 is provided in order to execute steps S42 and 43. Step S41 is executed when an error is detected in step S14. In other words, if an error is detected in an error detection process using the first predicted value, the first predicted value is held in step S41.

If no error is detected in an error detection process using the first predicted value (no error in step 14), then the flow returns to step S12 without updating the first through third predicted values, and waits for the next radio frame.

If an error is detected in an error detection process using the first predicted value (error in step 14), then in step S41, the first predicted value is stored in a register y; and then the error detection process is executed using the second predicted value in steps S15 and S16. At this time, if no error is detected in the error detection process using the second predicted value (no error in step S16), it is judged that the information length of the radio frame coincides with the second predicted value and the flow proceeds to step S42.

In step S42, the second predicted value used in step S16 is set as the first predicted value for the next radio frame. Specifically, the second predicted value currently stored in the memory area x(1) is written in the memory area x(0) which stores the first predicted value. And, the first predicted value stored in the register y is written in the memory area x(1) which stores the second predicted value.

If an error is detected in the error detection process using the second predicted value (error in step S16), then the error detection process is executed using the third predicted value in steps S17 and S18. At this time, if no error is detected in the error detection process using the third predicted value (no error in step S18), it is judged that the information length of the radio frame coincides with the third predicted value and the flow proceeds to step S43.

In step S43, the third predicted value used in step S18 is set as the first predicted value for the next radio frame. Specifically, the third predicted value currently stored in the memory area x(2) is written in the memory area x(0) which stores the first predicted value, and the first predicted value stored in the register y is written in the memory area x(2) which stores the third predicted value.

If an error is detected in each of the error detection processes (steps S14, S16 and S18), then an error handling process is performed in step S19, and the flow returns to step S11. Specifically, in this first embodiment, if the information length of a received radio frame is not detected, the error detection process for the subsequent radio frame is performed using the initial setting.

Figure 9A:
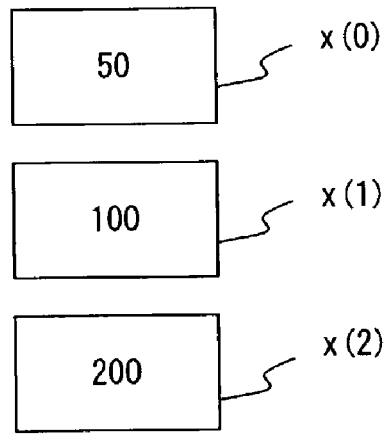
FIGS. 9A through 9C show the respective states of memory areas for storing a predicted value.

A specific example is described below. In the following description, it is assumed that "50 bits", "100 bits" and "200 bits" are set in the memory areas x(0) for the first predicted value, the memory area x(1) for the second predicted value and the memory area x(2) for the third predicted value provided in the control unit 23, respectively, by the process in step S11. FIG. 9A shows the states of the memory areas x(0), x(1) and x(2) at this time.

Case 1: Consecutively receiving frames storing 100 bits of information, after consecutively receiving a prescribed number of frames storing 50 bits of information.

In this case, while consecutively receiving frames storing 50 bits of information, no error is detected in the error detection process using the first predicted value (50 bits). Specifically, "no error" is detected in step S14, and neither step S16 nor S18 is executed. Therefore, the memory areas x(0) through x(2) are not updated, and the respective states shown in FIG. 9A are maintained.

Then, when a frame storing 100 bits of information is received, no error is detected in the error detection process using the second predicted value (100 bits). Specifically, "no error" is detected in step S16, and step S42 is executed. In step 42, as described above, currently used second predicted value is written in the memory area x(0), and currently used first predicted value is written in the memory area(1). As a result, the memory areas x(0) through x(2) become the respective states shown in FIG. 9B.

Figure 9B:
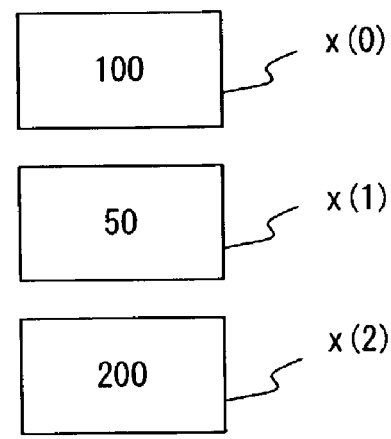

Then, while consecutively receiving frames storing 100 bits of information, no error is detected in the error detection process using the first predicted value (100 bits) Specifically, "no error" is detected in step S14, and neither step S16 nor S18 is executed. Therefore, the memory areas x(0) through x(2) are not updated, and the respective states shown in FIG. 9B are maintained.

Case 2: Consecutively receiving frames storing 200 bits of information, after consecutively receiving a prescribed number of frames storing 50 bits of information.

In this case, the operations performed while consecutively receiving frames storing 50 bits of information is the same as the operations in case 1. On receipt of a frame storing 200 bits of information, no error is detected in the error detection process using the third predicted value (200 bits). Specifically, "no error" is detected in step S18, and step S43 is executed. In step S43, as described above, currently used third predicted value is written in the memory area x(0), and currently used first predicted value is written in the memory area x(2). As a result, the memory areas x(0) through x(2) hold respective states shown in FIG. 9C.

Figure 9C:
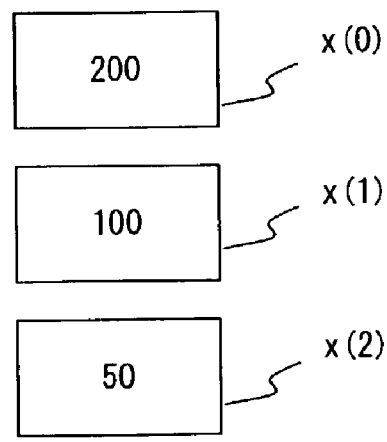

Then, while consecutively receiving frames storing 200 bits of information, no error is detected in the error detection process using the first predicted value (200 bits). Specifically, "no error" is detected in step S14, and neither step S16 nor S18 is executed. Therefore, the memory areas x(0) through x(2) are not updated, and the respective states shown in FIG. 9C are maintained.

Figure 10:
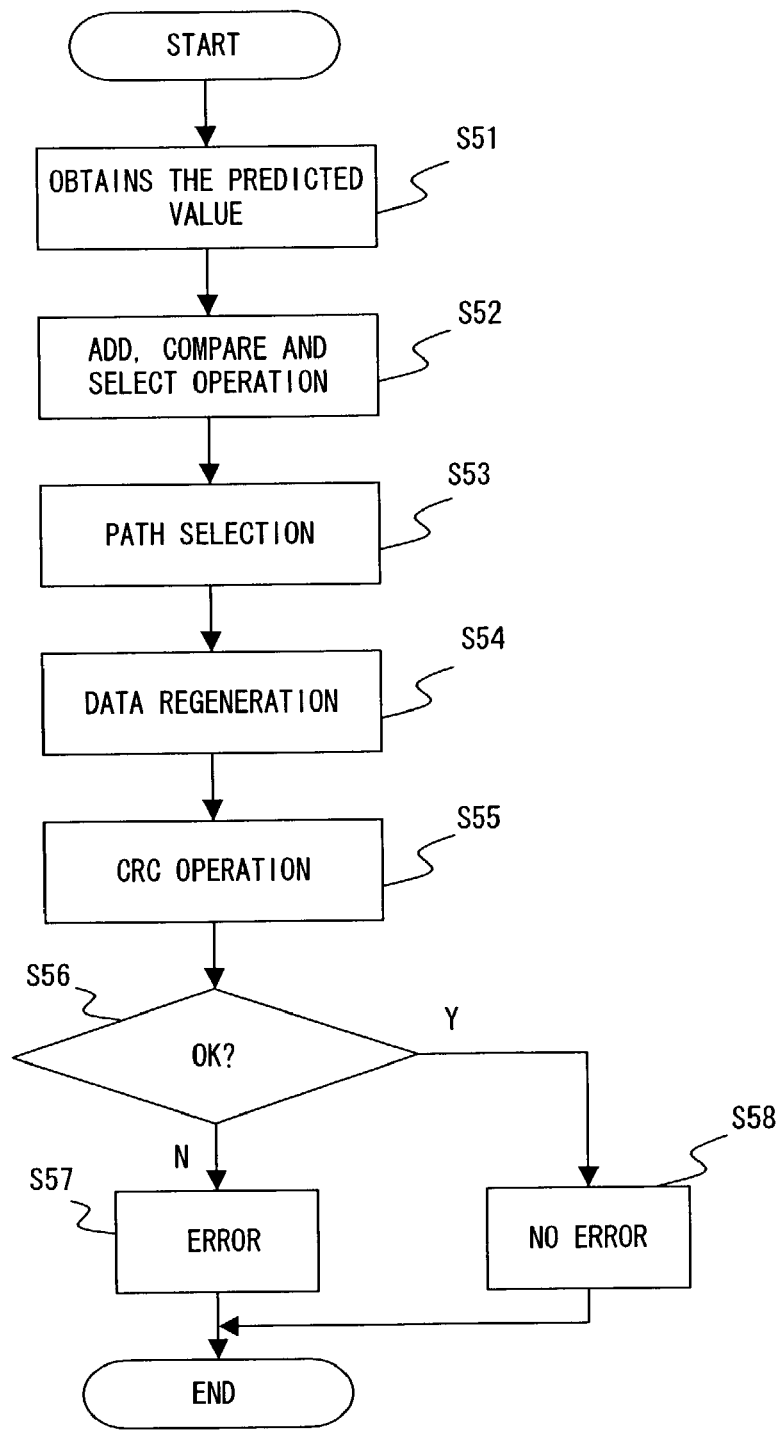
FIG. 10 is a flowchart showing an error detection process.

Here, the error detection process is described with reference to FIG. 10. The processes of the flowchart shown in FIG. 10 correspond to the error detection processes in steps S14, S16 and S18. The Viterbi decoder 24 and CRC error detection unit 25 which are shown in FIG. 7 execute the processes in this flowchart.

In step S51, the predicted value provided by the control unit 23 is obtained. Specifically, if the flowchart shown in FIG. 10 is executed as steps S14, S16 and S18, the first, second and third predicted values, respectively, are obtained.

In steps S52 and S53, N bits of data are regenerated/extracted from the received frame, where "N" corresponds to a predicted value obtained in step S51, and Viterbi decoding is performed on the data. Here, "N bits corresponds to a predicted value" has already been described with reference to FIG. 6. The Viterbi decoding process includes an ACS (Add, Compare and Select) operation, and may, for example, select the most likely path (or a path with the fewest predicted errors) using the trellis chart. Since Viterbi decoding is a known art, the detailed description is omitted.

In step S54, a data string is regenerated based on the path selected in step S53. Then, in step S55, the CRC operation on the data string obtained in step S54 is performed. In this CRC operation, for example, a remainder is calculated by dividing the data string obtained in step S54 by a prescribed generation polynomial.

In step S56, the presence of an error is determined based on the result of the CRC operation. Generally, if the remainder of the division is zero, it is judged that there is "no error". If the remainder is non-zero, it is judged that there is an "error". If an error is detected, an error signal is outputted in step S57. On the other hand, if no error is detected, a non-error signal is outputted in step S58.

FIG. 11 is a flowchart showing the second embodiment of the BTFD algorithm of the present invention. The second embodiment is also based on the algorithm shown in FIG. 3, like the first embodiment.

In the first embodiment described above, if the information length of a received radio frame cannot be detected, an error handling process is performed and the flow returns to step S11. However, in the second embodiment, if the information length of a received radio frame cannot be detected, an error handling process is performed and the flow returns to step S12. In this way, according to the algorithm of the second embodiment, if the information length of an immediately previous frame cannot be detected, the latest information length detected will be used as the first predicted value.

FIG. 12 compares the first embodiment with the second embodiment. In this example, it is assumed that the n-th frame through the (n+3)th frame have been received. It is also assumed that the n-th frame and the (n+1)th frame store 50 bits of information and 100 bits of information, respectively. Furthermore, it is assumed that the information length of the (n+2)th frame cannot be detected due to a transmission error or something.

Figures 12A, 12B:
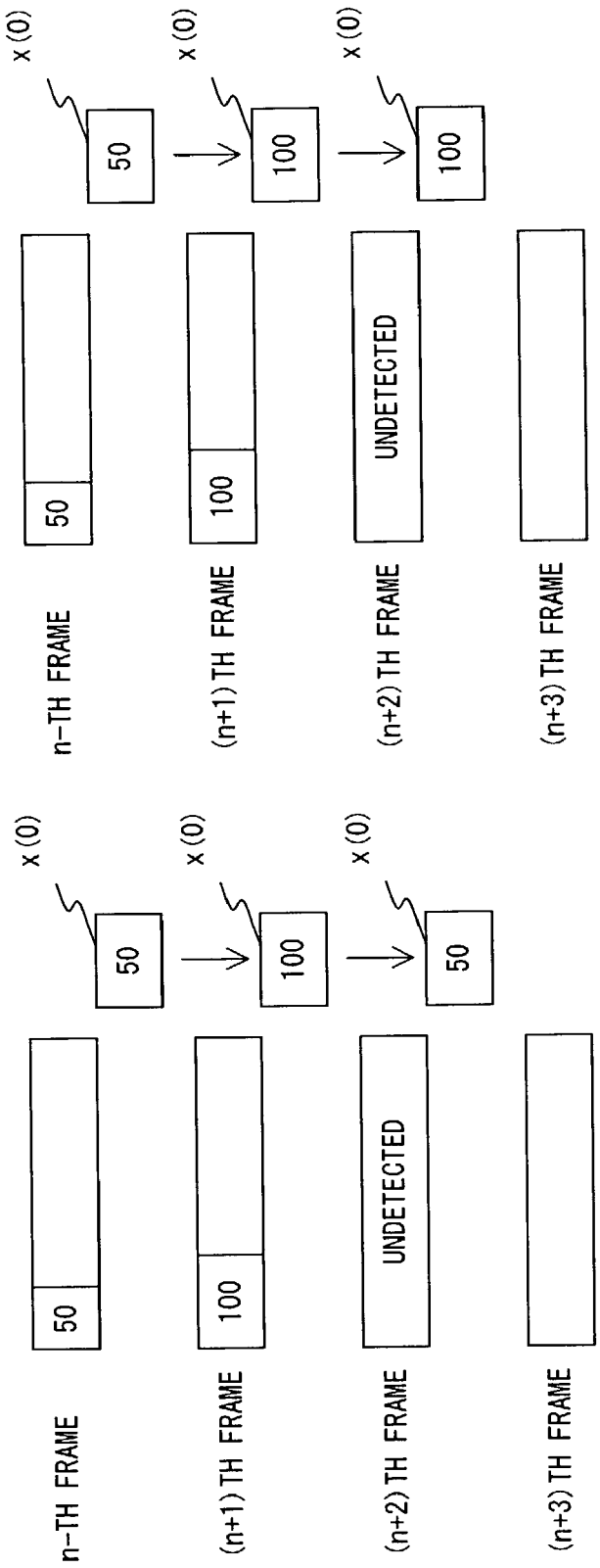
FIGS. 12A and 12B compare the first and second embodiments.

FIG. 12A shows the operation of the algorithm of the first embodiment shown in FIG. 8. According to this algorithm, first, on receipt of the n-th frame storing 50 bits of information, "50 bits" is written in the memory area x(0) which stores the first predicted value. Then, on receipt of the (n+1)th frame storing 100 bits of information, "100 bits" is written in the memory area x(0). Further, if the information length of the (n+2)th frame cannot be detected, as shown in FIG. 8, then step S11 of the flowchart is executed. As a result, "50 bits" is written in the memory area x(0). Then, on receipt of the (n+3)th frame, an error detection process is performed using "50 bits" as the first predicted value.

FIG. 12B shows the operation of the algorithm of the second embodiment shown in FIG. 11. According to this algorithm, the operations performed on receipt of the n-th frame and the (n+1)th frame is the same as the operations of the first embodiment. Specifically, immediately after the (n+1)th frame is received, "100 bits" is stored in the memory area x(0). Then, if the information length of the (n+2)th frame cannot be detected, as shown in FIG. 11, the flow returns to step S12 without executing step S11. As a result, "100 bits" is stored in the memory area x(0). Then, on receipt of the (n+3)th frame, an error detection process is performed using "100 bits" as the first predicted value.

FIG. 13 is a flowchart showing the third embodiment of the BTFD algorithm of the present invention. This embodiment is based on the algorithm shown in FIG. 4. Among the step numbers used in FIG. 13, the same numbers as those used in FIG. 4 represent the same processes.

In the third embodiment, the number of detections is checked for each information length of a radio frame, and the information length with the greatest number of detections is used as the first predicted value. For example, if 100 bits of information is frequently used and both information lengths of 50 bits and of 200 bits are not used as often, "100 bits" is set as the first predicted value. Then, on receipt of a radio frame, an error detection process is performed assuming that the frame stores 100 bits of information. If an error is detected in the error detection process, the error detection process is repeated using the second and/or third predicted values.

Specifically, according to the algorithm of the third embodiment, steps S54 and S56 are executed as step S32 (process B) shown in FIG. 4. Steps S41 and S51 are provided in order to execute steps S54 and S56. The process of step S41 is holding the first predicted value used in the current error detection process in a register y, when an error is detected in step S14. On the other hand, the process of step S51 is holding the second predicted value used in the current error detection process in a register z, when an error is detected in step S16. Furthermore, the process of step S52, S53 or S55 is incrementing a counter corresponding to the detected information length, when the information length of a received radio frame is detected.

Figure 14A:
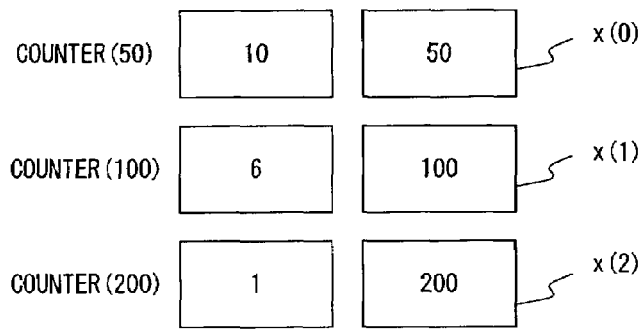
FIGS. 14A through 14D explain the algorithm of the third embodiment.

In step S54 (process C), the following process is performed.
IF Counter(x(0))<Counter(x(1))
  Then x(0)=x(1), x(1)=y
In step S56 (process D), the following process is performed.
IF Counter(x(1))<Counter(x(2)
  Then x(1)=x(2), x(2)=z
    IF Counter(x(0))<Counter(x(1))
      Then x(0)=x(1), x(1)=y A specific example of the operation of the third embodiment is described below. In the following description, it is assumed that the counter(50), the counter(100), and the counter(200), and the memory areas x(0) through x(2) are in the respective states shown in FIG. 14A.

Figure 14B:
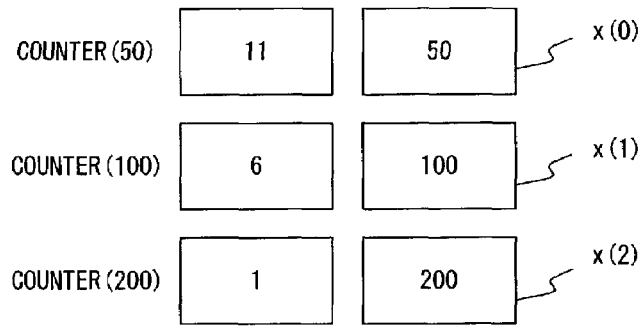

Case 1: When receiving a frame storing 50 bits of information at the state shown in FIG. 14A In this case, since the information length of a received frame coincides with the first predicted value stored in the memory area x(0) (no error in step S14), the counter(50) is incremented in step S52. As a result, each of the counters and each of the memory areas go to the respective states shown in FIG. 14B. In this case, the memory areas x(0) through x(2) are not updated.

Figure 14C:
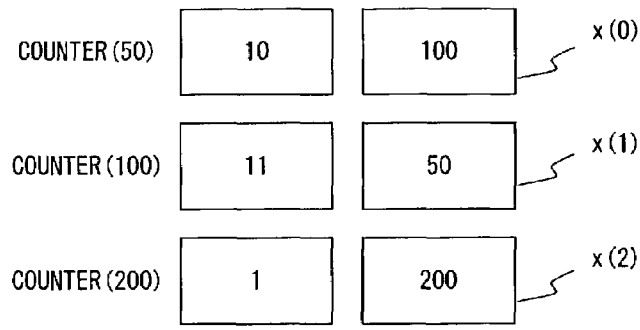

Case 2: When receiving five consecutive frames storing 100 bits of information in the state shown in FIG. 14A In this case, since the information length of each received frame coincides with the second predicted value stored in the memory area x(1) (no error in step S16), in step S53, the counter(100) is incremented every time one of these frames is received. As a result, each of the counters goes to the respective state shown in FIG. 14C. Then, in step S54, the counters(50) and(100) are compared. In this case, since the value of the counter(100) is greater than that of the counter (50), "100 bits" is written in the memory area x(0) for the first predicted value, and "50 bits" is written in the memory area x(1) for the second predicted value. As a result, each of the memory areas goes to the respective state shown in FIG. 14C.

Figure 14D:
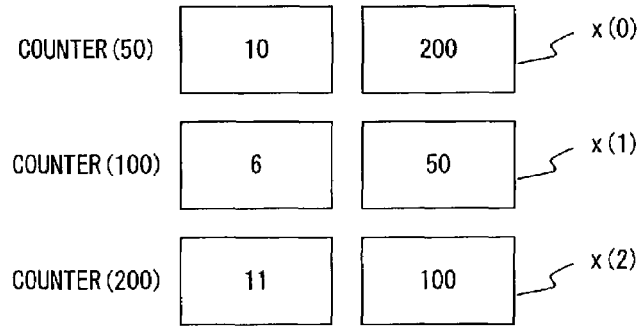

Case 3: When receiving ten consecutive frames storing 200 bits of information in the state shown in FIG. 14A In this case, since the information length of each received frame coincides with the third predicted value stored in the memory area x(2) (no error in step S18), the counter(200) is incremented every time one of these frames is received in step S55. As a result, each of the counters goes to the respective state shown in FIG. 14D. Then, in step S56, the counters(100) and(200) are compared. In this case, since the value of the counter(200) is greater than that of the counter (100), "200 bits" is written in the memory area x(1) for the second predicted value, and "100 bits" is written in the memory area x(2) for the third predicted value. Then, the counters(50) and the counter(200) are compared. In this case, since the value of the counter(200) is greater than that of the counter(50), "200 bits" is written in the memory area x(0) for the first predicted value, and "50 bits" is written in the memory area x(1) for the second predicted value. As a result, each of the memory areas goes to the respective state shown in FIG. 14D.

After the memory areas x(0) through x(2) are updated in this way, an error detection process is performed according to the updated content.

In this way, according to the algorithm of the third embodiment, the order of the predicted values to be used in the error detection process is determined based on the numbers of detections of information lengths of 50 bits, 100 bits and 200 bits.

Figure 15:
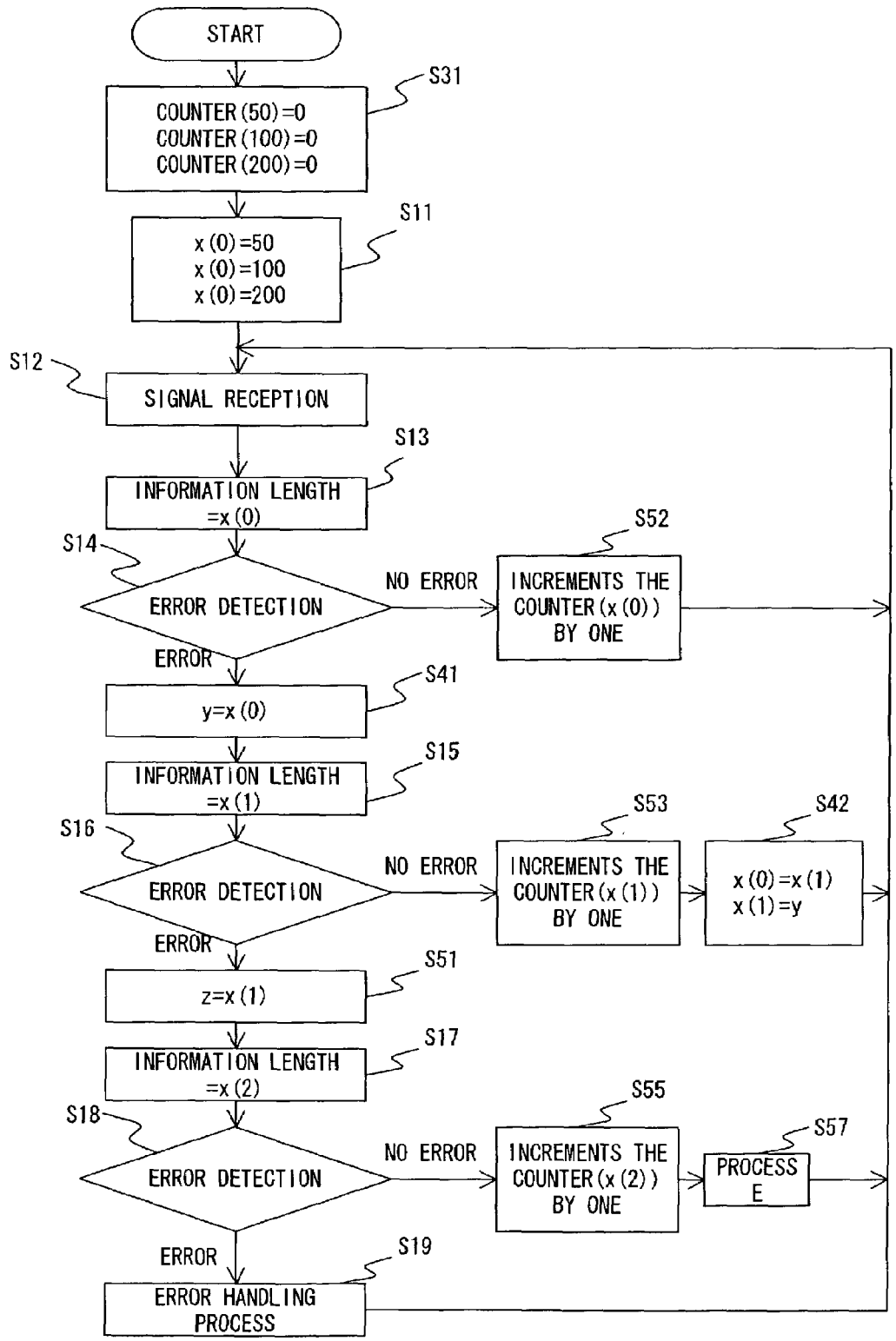
FIG. 15 is a flowchart showing the fourth embodiment of the BTFD algorithm of the present invention.

FIG. 15 is a flowchart showing the fourth embodiment of the BTFD algorithm of the present invention. The algorithm of the fourth embodiment can be basically implemented by combining the concepts of the second and third embodiments. Specifically, according to the algorithm of the fourth embodiment, an error detection process is performed assuming that the information length of the relevant frame coincides with the information length of a previous frame, and if an error is detected in the process, the next predicted value is determined based on the past detection frequency.

In order to implement the operation described above, every time the information length of a received frame is detected, a corresponding counter is incremented (steps S52, S53 and S55). In this case, if the information length is detected in an error detection process using the first predicted value, the first through third predicted values for the next frame are not modified. If the information length is detected in the error detection process using the second predicted value, the detected information length is set as the first predicted value for the next frame by executing step S42. Furthermore, if the information length is detected in the error detection process using the third predicted value, step S57 is executed. In step S57, the following process is performed.

x(0)=x(2)

IF Counter(x(1))>Counter(x(2))
  Then x(1)=y, x(2)=z
    Else x(1)=z, x(2)=y

Specifically, in step S57, first, the detected information length of the relevant frame is set as the first predicted value for the next frame. The second and third predicted values are determined based on the past detection frequency.

As described above, according to the BTFD algorithm of the present invention, the information length of the relevant frame is predicted based on the information length of an immediately previous frame or past frames, and the information length of the relevant frame is detected using the predicted value. Therefore, in a communication system that has a specific tendency to use identical information length, the probability that the prediction described above is correct will be improved, and the number of times that the error detection process is executed will be reduced. As a result, the time needed for a receiver to process a radio frame is reduced and the power consumption of the receiver is also reduced.

According to the BTFD algorithm of the embodiments described above, in a case where a plurality of pieces of information with identical length are consecutively transmitted or in a case where information with a specific length is frequently transmitted, efficiency is improved. Therefore, if a transmitter can implement such data transmission function, the efficiency of a receiver will be further improved.

FIG. 16 is a flowchart showing the first embodiment of the operation of a transmitter. The processes in this flowchart are performed, when the algorithm shown in FIG. 8 is executed in a corresponding receiver.

Instep S61, the initial values of a first selection value x(0), a second selection value x(1) and a third selection value x(2) are set. In the example of FIG. 16, "50 bits", "100 bits" and "200 bits" are set as the first through third selection values, respectively.

In step S62, a buffer corresponding to the first selection value is checked to see whether it stores information. If information is stored in the buffer corresponding to the first selection value, then the information is read from the buffer and is outputted in step S63. On the other hand, if the buffer corresponding to the first selection value does not store information, the first selection value is stored in a register y in step S64.

In step S65, a buffer corresponding to the second selection value is checked to see whether it stores information. If information is stored in the buffer corresponding to the second selection value, the information is read from the buffer and is outputted in step S66. Then, in step S67, the second selection value used in the relevant selection process is set as the first selection value in the next process.

Similarly, in step S68, a buffer corresponding to the third selection value is checked to see whether it stores information. If information is stored in the buffer corresponding to the third selection value, the information is read from the buffer and is outputted in step S69. Then, in step S70, the third selection value used in the relevant selection process is set as the first selection value in the next process.

If no buffer stores information, the first though third selection values are initialized again by executing step S61.

By this procedure, frames with identical information length can be consecutively transmitted as much as possible.

FIG. 17 is a flowchart showing the second embodiment of the operation of a transmitter. The processes in this flowchart are performed, when the algorithm shown in FIG. 11 is executed in a corresponding receiver. In this embodiment, if no buffer stores information, the flow returns to step S62 without executing step S61. Therefore, in this case, the first through third selection values are not initialized.

FIG. 18 is a flowchart showing the third embodiment of the operation of a transmitter. The processes in this flowchart are performed, when the algorithm shown in FIG. 13 is executed in a corresponding receiver.

In the method of this embodiment, the number of times each information length is used in a transmission is monitored, and frames with the information length transmitted most are selected with priority. In order to implement this operation, a counter corresponding to the information length is incremented every time a transmitter transmit a frame (steps S83, S84, and S86). In addition, when a frame is transmitted according to the second selection values, then step S85 (process F) is executed, and when a frame is transmitted according to the third selection values, then step S87 (process G) is executed.

Process F is basically the same as process C shown in FIG. 13. Process G is basically the same as process D shown in FIG. 13. However, in processes C and D, the predicted value used in an error detection process is updated, while in processes F and G, the selected value used to select information from the buffers is updated.

Figure 19:
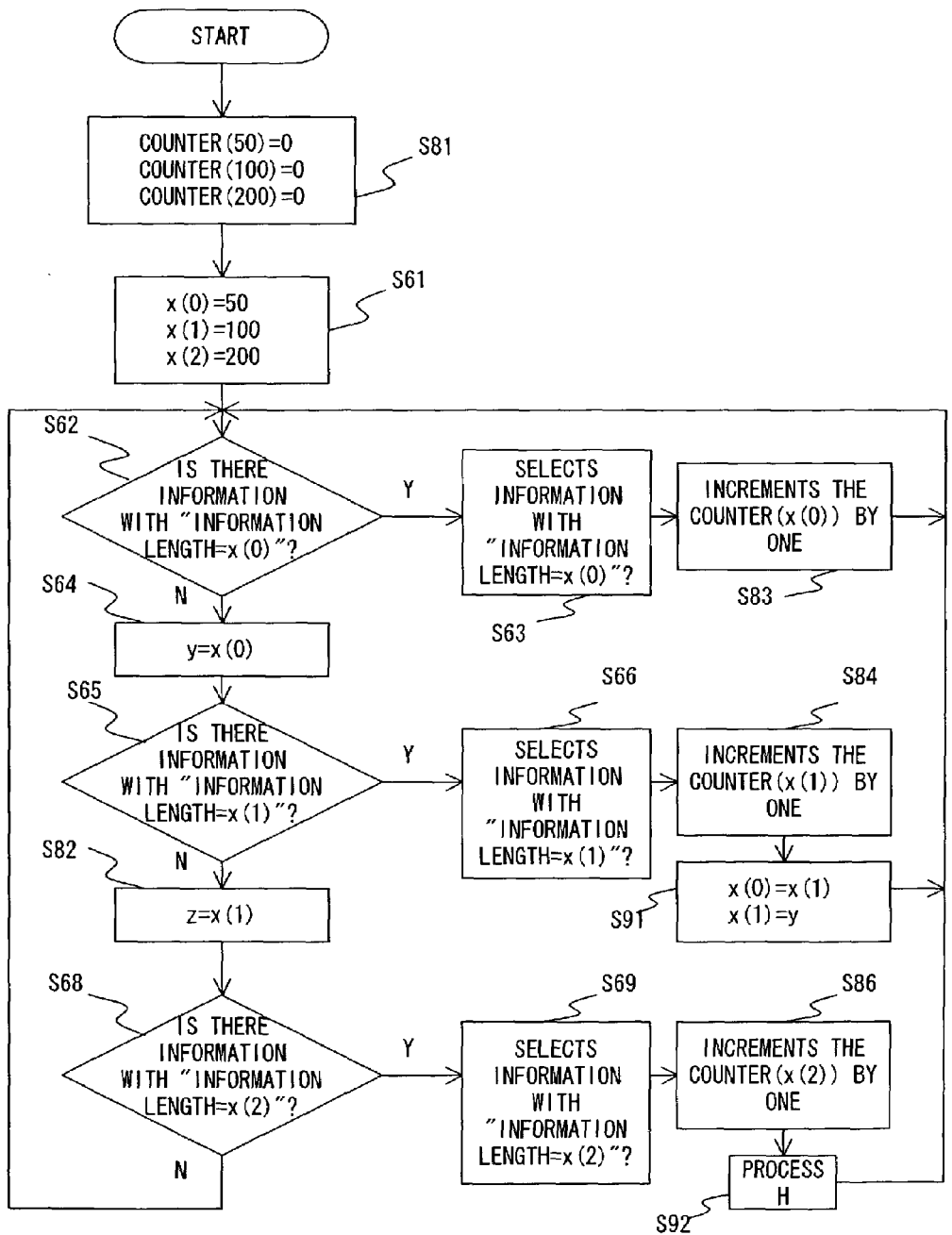
FIG. 19 is a flowchart showing the fourth embodiment of the operation of a transmitter.

FIG. 19 is a flowchart showing the fourth embodiment of the operation of a transmitter. The processes in this flowchart are performed, when the algorithm shown in FIG. 15 is executed in a corresponding receiver.

In the method of this embodiment, a plurality of frames with identical information length are consecutively transmitted as much as possible. After all the frames with identical information length are transmitted, frames with the information length transmitted more frequently are selected with priority. In order to implement this operation, step S91 is executed when a frame is transmitted according to the second selection value, and step S92 (process H) is executed when a frame is transmitted according to the third selection value.

The process in step S91 is basically the same as that in step S42 shown in FIG. 15. Process H is basically the same as process E shown in FIG. 15. However, while in step S42 and process E, the predicted value used in an error detection process is updated, in step S91 and process H, the selection value used to select information from the buffers is updated.

As described above, in the communication system of this embodiment, since a procedure for determining an information length in a transmitter and a procedure for predicting the information length in a receiver can be made the same, there is a higher probability that the prediction for the information length of a transmission frame is correct in the receiver. As a result, the number of times that the error detection process is performed in a receiver is reduced and therefore the power consumption of the receiver is also reduced.

Next, an embodiment in a case where the BTFD algorithm of the present invention is applied to W-CDMA is described.

According to the standardized rating of W-CDMA, BTFD may be applied to the following three communications.

Upward communications

Downward communications (DTX indication with Fix position)

Downward communications (DTX indication with Flexible position)

Here, "upward communications" represent signal transmissions from a mobile station to a base station or an exchange station. "Downward communications" represent signal transmissions from a base station or an exchange station to a mobile station.

It is downward communications (DTX indication with Fix position) out of the three communications that the present invention can be applied to easily and practically. Therefore, here an embodiment is described to which the downward communications (DTX indication with Fixed position) of W-CDMA is applied. In addition, in the following embodiment, a case where audio data is transmitted is assumed.

It is assumed that audio data is transmitted in one of the nine communications modes shown in FIG. 20. The communication mode can be dynamically switched depending on the amount of audio data being transmitted. For example, while the user of a transmitting terminal is talking, the amount of information being transmitted is large. Therefore, during this period, audio data is transmitted in mode "AMR 12.2". However, there is no need to transmit audio data, while the user of the transmitting terminal is silent. Therefore, in that case, audio data is transmitted in a mode "SID-UPDATE". Here, "SID-UPDATE" is a signal indicating background noise which is regularly updated.

In each of the communication modes, information in class A through class C is transmitted. Information in class A is information with top priority, and the information is needed in all communications except several exceptions. Information in class B is information with the second priority next to information in class A, and the information is needed when transmitting audio data. Information in class C is information with the lowest priority, and the information is used to improve quality of voice.

As shown in FIG. 20, information in each class is transmitted after segmented into units of a prescribed length for each communication mode. For example, in mode "AMR12.2", information in class A, information in class B and information in class C are segmented into units of 81 bits, 103 bits and 60 bits, respectively.

Figure 21:
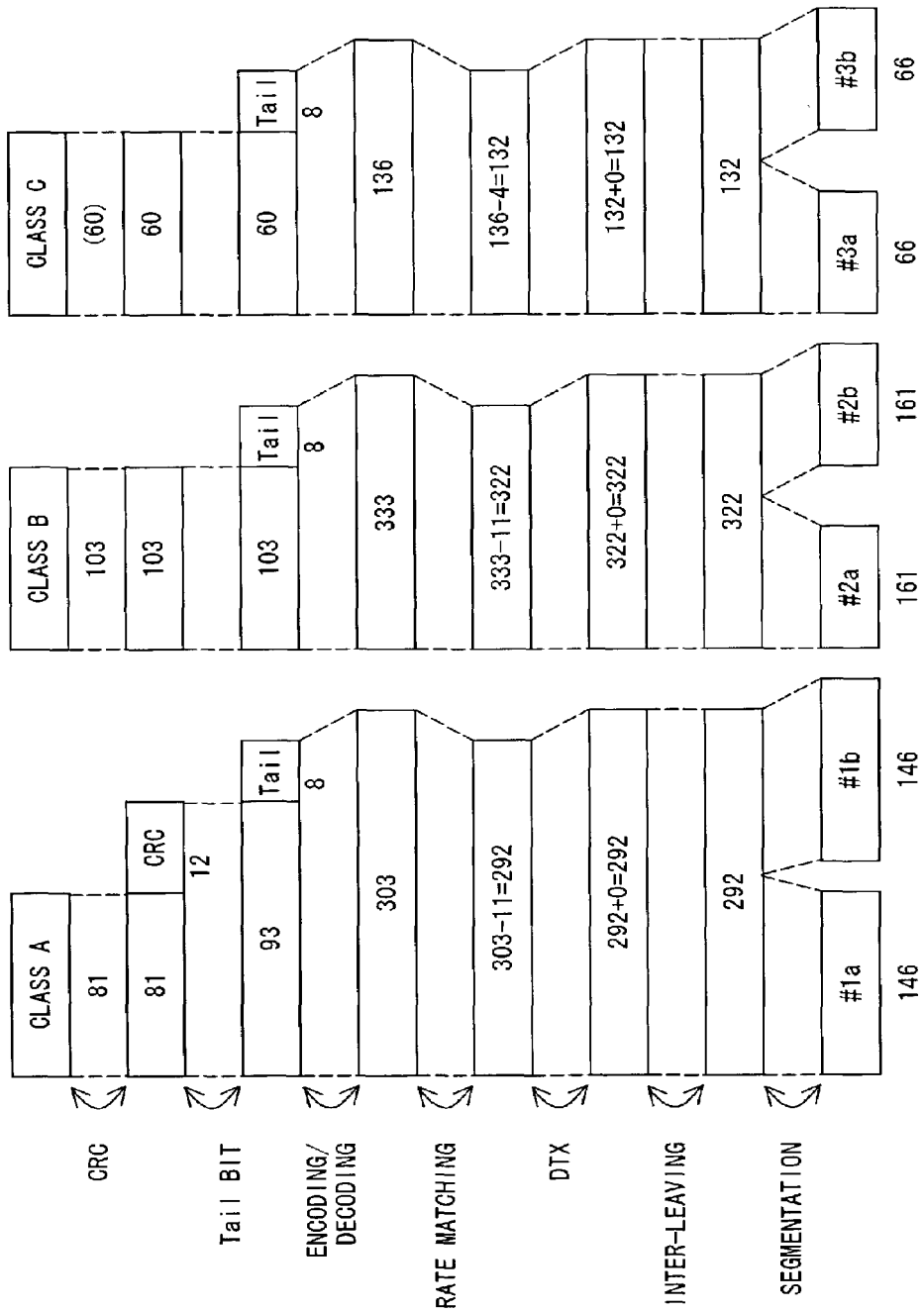
FIG. 21 shows the disassembly/assembly of information transmitted in "AMR 12.2".

The operation of a transmitter is described with reference to FIGS. 21 through 23. FIG. 21 shows the disassembly/assembly of information transmitted in mode "AMR12.2". When transmitting audio data in mode "AMR 12.2", a transmitter obtains 81 bits of class A data, 103 bits of class B data and 60 bits of class C data. In this case, CRC of 12 bits is appended to class A data with top priority. An 8 bit tail is appended to the data in each class (in class A, data with, a CRC appended) and the data is encoded. In this case, a convolutional code is used to encode the data. The encoding ratio of classes A and B is "1:3", and that of class C is "1:2".

Then, if necessary, a rate matching process and a DTX addition process are performed on the data in each class. These processes set the number of data bits in each class to a predetermined value (292 bits, 322 bits and 132 bits for classes A, B and C, respectively) Furthermore, an interleaving process is performed on each class. Here, interleaving process is a process that sorts bits according to a prescribed rule (randomization process). Then, data in each class are segmented into the respective predetermined number of bits.

FIG. 22 shows the disassembly/assembly of control data. Since the procedure for processing control data is the same as that for processing audio data, the description is omitted. However, in the procedure for processing the control data, four data blocks are generated from one control data block.

Figure 23:
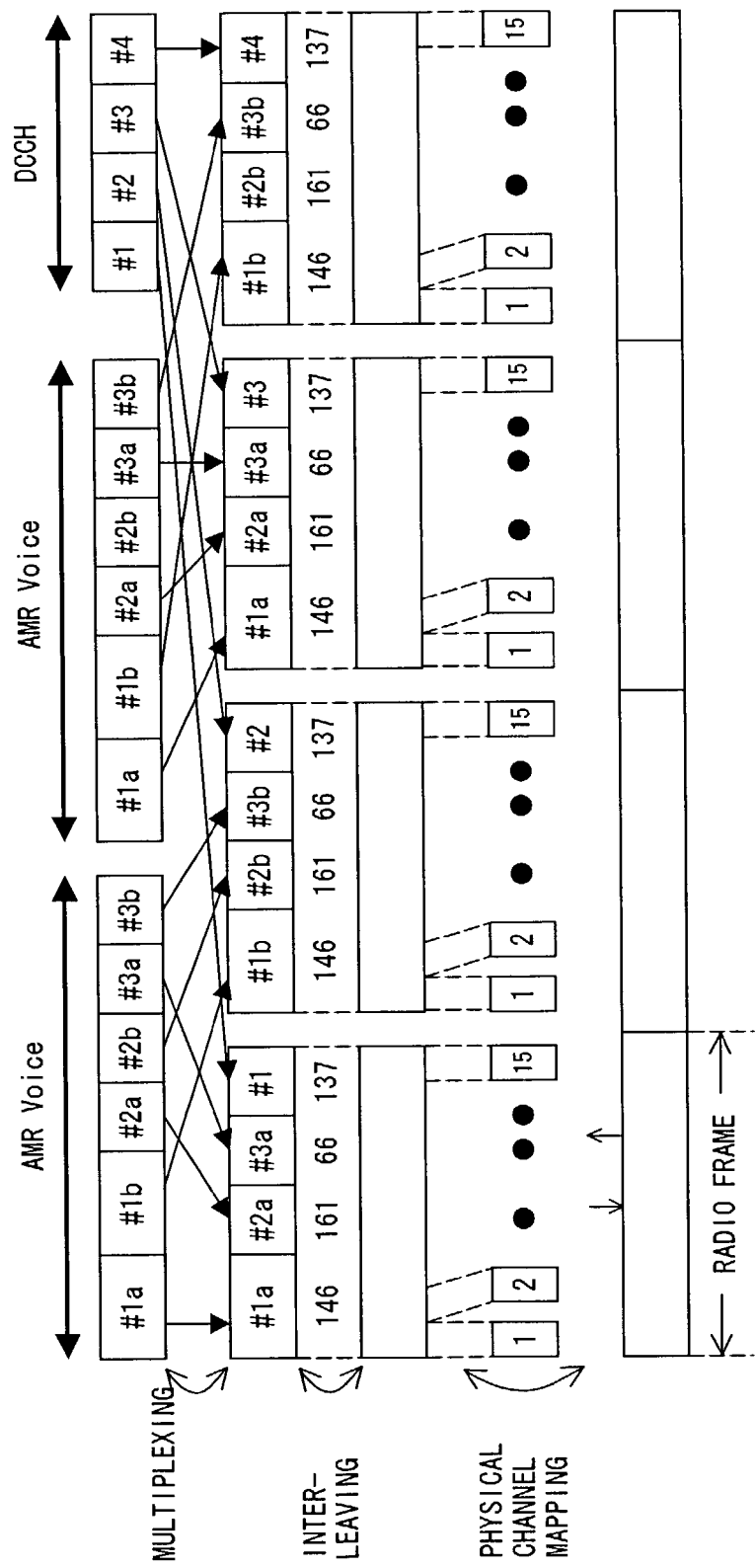
FIG. 23 explains "AMR 12.2" and the disassembly/assembly of a radio frame for the control data.

FIG. 23 explains "AMR 12.2" and disassembly/assembly of a radio frame for the control data. The audio data shown in FIG. 21 and the control data shown in FIG. 22 are multiplexed at a ratio of 2:1. Four data blocks are generated in this multiplexing process. In this case, each data block includes corresponding data in each class and control data.

The interleaving process is performed on each of the data blocks, then each block is segmented into 15 blocks, and finally each of the resulting 15 blocks is stored in the corresponding slot of a radio frame.

Figure 24:
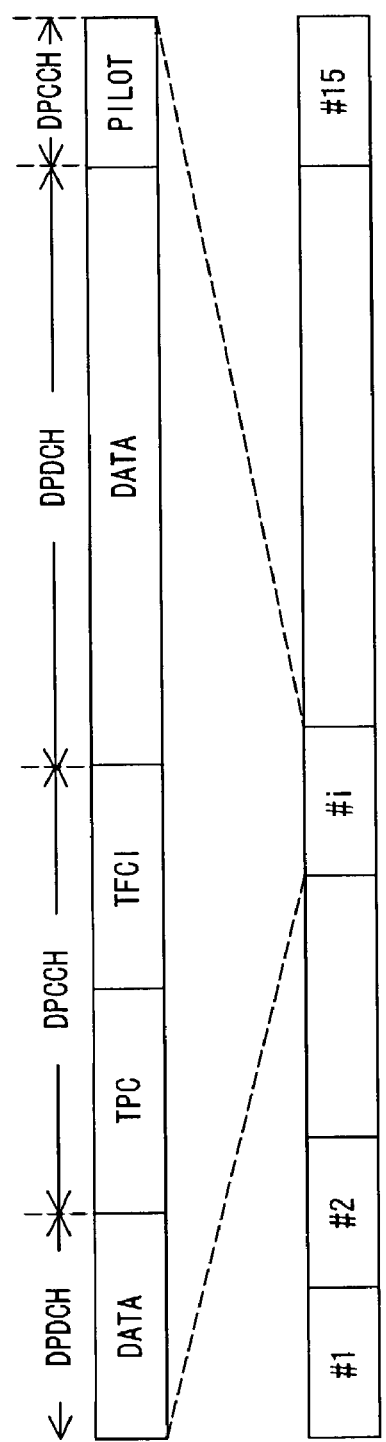
FIG. 24 shows the structure of a radio frame.

As shown in FIG. 24, a radio frame is composed of 15 slots. Each slot is composed of a data area, a TPC area, a TFCI area and a pilot signal area. The data area stores data obtained by the processes shown in FIGS. 21 through 23. The TPC (Transmit Power Control) area stores information indicating transmitting power. The TFCI (Transport Format Combination Indicator) area can store information, such as the number of data bits stored in the relevant slot or a communication mode indicator. In this embodiment, it is assumed that the TFCI area is deleted to maximize the amount of data stored in each slot, that is, to reduce the overhead as much as possible. A pilot signal for synchronization is stored in the pilot signal area.

As described above, when audio data is transmitted in mode "AMR 12.2", the transmitter generates radio frames in the procedure shown in FIGS. 21 through 24 and sequentially outputs the radio frames.

Figure 25:
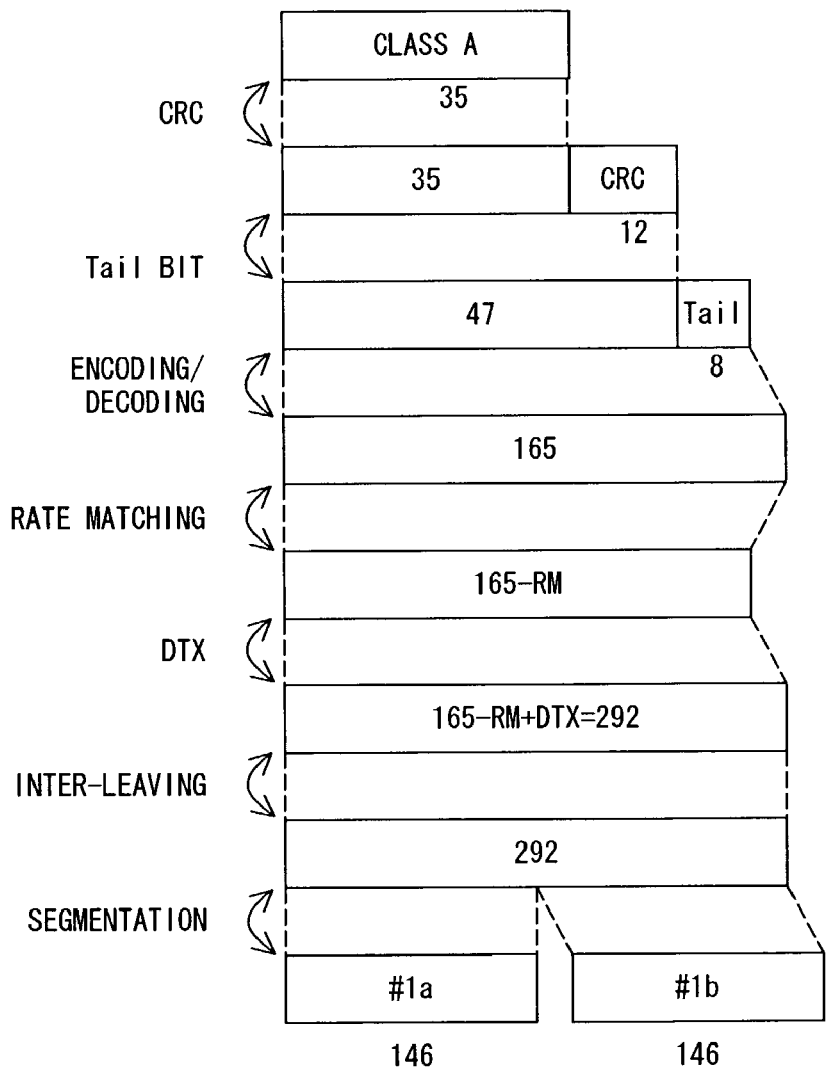
FIG. 25 shows the disassembly/assembly of information transmitted in "SID-UPDATE".
Figure 26:
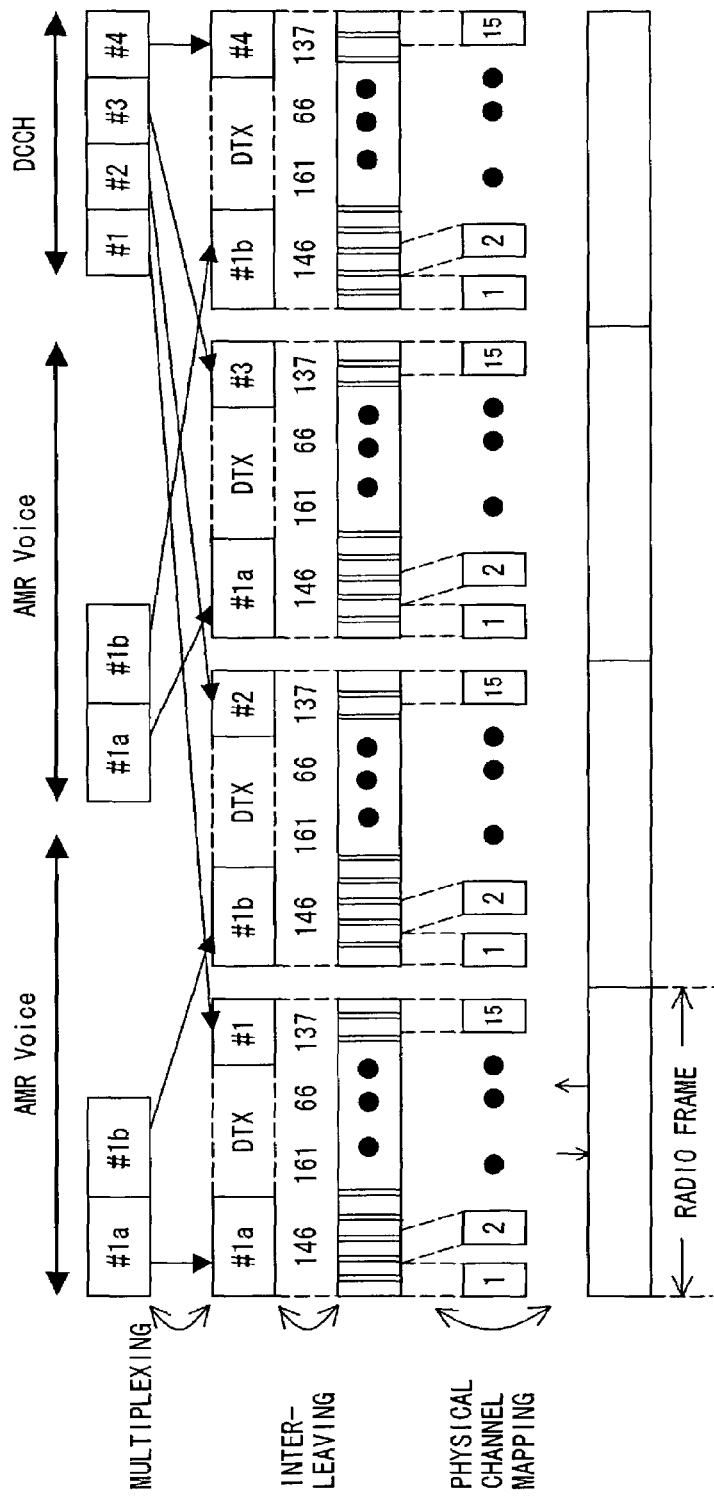
FIG. 26 explains "SID-UPDATE" and the disassembly/assembly of a radio frame for the control data.

FIGS. 25 and 26 show the disassembly/assembly of a radio frame in mode "SID-UPDATE". "SID-UPDATE" is a communication mode that is selected when, for example, the user of a terminal is silent.

In mode "SID-UPDATE", only 35 bits of class A data are transmitted as audio data. Since the transmission of the control data in mode "SID-UPDATE" is basically the same as the transmission of the control data in mode "AMR 12.2", the description is omitted.

CRC and tail bits are appended to the 35 bits of class A data and the data is encoded. Through this encoding process, the number of data bits becomes 165. Then, in the rate matching process and the DTX addition process, a prescribed number of bits are appended/deleted to/from the encoded data, and by appending DTX, a data block of 292 bits is generated. Then, the interleaving process and the segmentation process are performed on the data.

As shown in FIG. 26, the audio data processed in the procedure shown in FIG. 25 are stored in the radio frame together with the control data. This assembly procedure is already described with reference to FIG. 23. However, since in mode "SID-UPDATE" there are neither class B data nor class C data, areas for storing class B data and class C data are filled with DTX.

As described above, a transmitter can transmit audio data while changing communication modes from time to time. In this embodiment, nine communication modes are provided. The amount of information transmitted from a transmitter to a receiver varies depending on the communication mode. For example, in mode "AMR 12.2", 81 bits of class A data are transmitted in each radio frame, while in mode "SID-UPDATE", 35 bits of class A data are transmitted in each radio frame.

However, when the transmitter transmits radio frames to the receiver, the communication mode and the number of bits in each class is not reported to the receiver. This notification is possible using the TFCI area of the radio frame shown in FIG. 24. However, in this embodiment, it is presumed that the TFCI area should not be used in order to reduce the overhead, thus the receiver would not receive this notification. Therefore, on receipt of a radio frame, the receiver must detect the information length in each class in the frame. The operation of a receiver is described below with reference to FIGS. 20 through 26.

On receipt of a radio frame, the receiver reverses the assembly procedure executed in a corresponding transmitter, as shown in FIGS. 21 through 24. Specifically, the receiver separates data stored in the radio frame into each class and performs an inverted interleaving process on each class. In this way, for example, the fourth state from the top shown in FIG. 21 or 25 is obtained. However, since DTX is not deleted, the total bit length is "303", which is the maximum bit length.

Then, the receiver detects the information length in class A using the BTFD algorithm of the present invention. In the system of this embodiment, as shown in FIG. 20, nine communication modes are provided. The information length in class A stored in a radio frame is one of 81, 65, 75, 61, 58, 55, 49, 42 or 35 bits. Therefore, the receiver detects the information length by performing an error detection process using the first through ninth predicted values corresponding to the information lengths of the above class A data. Here, the bit lengths of classes B and C uniquely correspond to the bit length of class A, as shown in FIG. 20. Therefore, the bit lengths of class B and class C can be uniquely recognized by detecting the information length of class A.

An embodiment is described below. Here, it is assumed that "81 bits" is set as the first predicted value. When performing an error detection process using "81 bits" as a predicted value, the receiver performs a decoding process assuming that the transmitter encodes audio data in mode "AMR 12.2". Specifically, in this case, as shown in FIG. 23, the receiver generates 303 bits of a data string assuming that "DTX=0" and "the information length adjusted by rate matching=11", and decodes the generated data string. Then, the receiver performs the CRC operation on 93 bits of data obtained by deleting 8 bits from the decoded result.

If an error is not detected in this CRC operation, the receiver outputs the resulting 81 bits as information in class A. Here, if there are 81 bits of information in class A, the bit length of class B and that of class C are uniquely recognized to be "103 bits" and "60 bits", respectively. Therefore, 103 bits of information in class B are reproduced by performing a decoding process which assumes that the transmitter has encoded 103 bits of information in class B. Likewise, 60 bits of information in class C are reproduced by performing a decoding process which assumes that the transmitter has encoded 60 bits of information in class C.

On the other hand, if the CRC operation detects an error on the 93 bits, the process described above is repeated using the second predicted value. In this embodiment, "35 bits" is set as the second predicted value. When performing an error detection process using "35 bits" as the predicted value, the receiver performs a decoding process assuming that the transmitter has encoded audio data in mode "SID-UP-DATE". Specifically, in this case, as shown in FIG. 25, the receiver generates a 165 bit data string by deleting a prescribed number of DTX bits and by performing a process corresponding to the rate matching process executed in the transmitter. Then, the receiver decodes the data string and deletes 8 bits from the decoded result. Then, the receiver performs the CRC operation on the resulting 47 bits.

If an error is not detected in this CRC operation, the receiver outputs 35 bits obtained by deleting the CRC from the 47 bits as information in class A. Here, in a case where the information in class A is 35 bits, there is no information in class B and class C.

On the other hand, if the CRC operation detects an error in the 47 bits, the process described above is repeated using the third, fourth, fifth predicted values and so on, until the information length of the radio frame is detected.

In this embodiment described above, the first through ninth predicted values are determined by the algorithm of the present invention. For example, according to the algorithm shown in FIG. 3, when information in class A is extracted from a received frame, the information length of that frame is set as the first predicted value for the next frame. According to the algorithm shown in FIG. 4, statistics on information length frequency are tracked and the first through ninth predicted values are determined based on the statistics.

In this embodiment described above, since the communication mode is uniquely correspond to the information length of class A data, the communication mode can be uniquely recognized by detecting the information length of the class A data, when the information length is detected using the BTFD algorithm of the present invention. Therefore, it is correct to say that the communication mode or a transmission format specified in the communication mode can substantially be detected by performing the BTFD algorithm in this embodiment.

Although only the first through fourth embodiments of the BTFD algorithm of the present invention are shown, the present invention is not limited to these embodiments. Specifically, for example, when detecting the information length of a received frame, a CRC operation can be performed using the information length detected in a previous frame, and if the CRC operation detects an error, the BTFD algorithm described in the "3G TS 25.212 version 3.1.0" can be executed. Alternatively, the average number of times the error detection processes is executed per frame is monitored while executing the algorithm of the first embodiment, and the algorithm can be automatically switched over to one of the second through fourth embodiments when the average value exceeds a prescribed value.

Although CDMA is adopted, in the embodiments described above, the present invention is not limited to CDMA. The present invention is widely applicable to a method for detecting the information length of a frame or the transmission format of the frame in a communication system which transmits frames of information.

What is claimed is:

1. A method for detecting an information length of a frame in a communication system which transmits frames storing information, comprising:
   generating a predicted value which predicts an information length of a relevant frame based on an information length of a frame received before;
   performing an error detection process on the relevant frame using the generated predicted value; and
   detecting the information length of the relevant frame based on the result of the error detection process.

2. The method according to claim 1, wherein the predicted value is generated based on an information length of an immediately previous frame.

3. The method according to claim 2, wherein the predicted value is generated based on an information length detected in the nearest past, when the information length of the immediately previous frame cannot be detected.

4. The method according to claim 2, wherein a transmitter, which transmits the frames, stores in a next frame information with the same information length as the information length of a frame transmitted immediately before with priority.

5. The method according to claim 4, wherein the transmitter stores in a frame to be transmitted information with an information length of a frame transmitted in the nearest past with priority, when the transmitter information with the same information length as an information length of a frame transmitted immediately before.

6. A method for detecting an information length of a frame in a communication system which transmits frames storing information, comprising:
   detecting an information length of each of a plurality of frames;
   checking a detected frequency for each information length;
   performing an error detection process assuming that information with one of the detected information length is stored in a relevant frame according to the detected frequencies; and detecting an information length of the relevant frame based on a result of the error detection process.

7. The method according to claim 6, wherein when receiving the frame, the error detection process is performed assuming that the information length of the relevant frame is the same as the information length of the immediately previous frame, and
the error detection process is performed assuming that an information length of the relevant frame coincides with a corresponding detected information length in descending order of the detected frequencies, when an error detection process detects an error in the relevant frame.

8. The method according to claim 6, wherein a transmitter which transmits the frames
checks a transmission frequency for each information length, and
stores in a frame information with an information length with the greatest transmission frequency with priority and transmits the frame.

9. The method according to claim 8, wherein the transmitter
stores in a frame information with the same information length as an information le of a frame transmitted immediately before, and transmits the frame, and
stores in a frame information with the information length with the greatest transmission frequency with priority and transmits the frame, when information with the same information length as the information length of the frame transmitted immediately before cannot be transmitted.

10. A detection device detecting an information length of a frame in a communication system which transmits frames storing information, comprising:
receiving means for receiving the frame;
predicting means for the generating a predicted value which predicts an information length of a relevant frame based on an information length of a frame received before the said receiving means;
the error detecting means for performing an error detection process on the relevant frame using the predicted value generated by said predicting means; and
information length detecting means for detecting an information length of the relevant frame based on the detection result of said error detecting means.

11. A detection device for detecting an information length of frame in a communication system which transmits frames storing information, comprising
receiving means for receiving a transmission frame;
extracting means for extracting a data string from the transmission frame received by said receiving means;
error detecting means for performing an error detection process on the data string extracted by said extracting means; and
information amount detecting means for detecting the amount of information stored in the transmission frame based on the detection result of said error detecting means, wherein
said extracting means determines the number of bits of data string to be extracted from the transmission frame based on a detection result by said information amount detecting means.

12. A detection device detecting a transmission format of information stored in a frame in a communication system which transmits frames storing information with an arbitrary transmission format among a plurality of transmission formats, comprising:
receiving means for receiving the frame;
predicting means for predicting the transmission format of information stored in the relevant frame based on the transmission format of information stored in a frame received before said receiving means;
error detecting means for performing an error detection process on the information stored in the relevant frame assuming that the transmission format of the information coincides with the predicted transmission format predicted by said prediction means; and
format detecting means for detecting the transmission format of information stored in the relevant frame based on the detection result of said error detection means.

13. A detection device detecting an information length of a frame in a communication system which transmits frames storing information, comprising:
a receiving unit receiving the frame;
a predicting unit generating a predicted value which predicts an information length of a relevant frame based on an information length of a frame received before by said receiving unit; an error detector performing an error detection process on the relevant frame using the predicted value generated by said predicting unit; and
an information length detector detecting an information length of the relevant frame based on the detection result of said error detector.

14. A detection device for detecting an information length of a frame in a communication system which transmits frames storing information, comprising:
a receiving unit receiving a transmission frame;
an extracting unit extracting a data string from the transmission frame received by said receiving unit;
an error detector performing an error detection process on the data string extracted by said extracting unit; and
an information amount detector detecting the amount of information stored in the transmission frame based on the detection result of said error detector, wherein
said extracting unit determines the number of bits of data string to be extracted from the transmission frame based on a detection result by said information amount detector.

15. A detection device detecting a transmission format of information stored in a frame in a communication system which transmits frames storing information with an arbitrary transmission format among a plurality of transmission formats, comprising:
a receiving unit receiving the frame;
the transmission format of information stored in the relevant frame based on the transmission format of information stored in a frame received before by said receiving unit;
an error detector performing an error detection process on the information stored in the relevant frame assuming that the transmission format of the information coincides with the predicted transmission format predicted by said prediction unit; and
a format detector detecting the transmission format of information stored in the relevant frame based on the detection result of said error detector.

16. A method for detecting an information length of a frame in a communication system which transmits frames storing information, comprising:
generating a candidate value which for an information length of a relevant frame based on an information length of a frame received before;

performing error detection process on the relevant frame firstly using the generated candidate value; and detecting the information length of the relevant frame based on the result of the error detection process.

17. A method for detecting an information length of a frame in a communication system which transmits frames storing information, comprising:

selecting a candidate value which for an information length of a relevant frame from among a plurality of candidates based on an information length of a frame received before;

performing error detection process on the relevant frame firstly using the selected candidate value; and detecting the information length of the relevant frame based on the result of the error detection process.

18. A method for specifying an information length of a received transmission frame by performing an error detection process sequentially using a plurality of information length candidates in a communication system where an information length of a transmission frame is variable, wherein an order of the plurality of information length candidates used in the error detection process for a following received transmission frame is changed at a receiving side based on a specifying result of information length for the previously received transmission frame.

19. An apparatus to detect information length of a frame in a communication system, said communication system transmitting frames storing information, said apparatus comprising:

a generator unit generating a candidate value for an information length of a relevant frame based on an information length of a previously received frame received;

an error detector performing error detection process on the relevant frame firstly using the generated candidate value; and an information length detector detecting the information length of the relevant frame based on the result of the error detection process.

20. An apparatus to detect an information length of a frame in a communication system which transmits frames storing information, said apparatus comprising:

means for selecting a candidate value for an information length of a relevant frame from among a plurality of candidates based on an information length of a frame received before;

means for performing error detection process on the relevant frame firstly using the selected candidate value; and means for detecting the information length of the relevant frame based on the result of the error detection process.

21. An apparatus to specify an information length of a received transmission frame by performing an error detection process sequentially using a plurality of information length candidates in a communication system where the information length of a transmission frame is variable, said apparatus comprising:

means for changing an order of the plurality of information length candidates used in an error detection process for a following a received transmission frame at a receiving side based on a specifying result of information length for the previously received transmission frame.

* * * * *